United States Patent
Murayama et al.

[11] Patent Number: 6,155,201
[45] Date of Patent: Dec. 5, 2000

[54] PLASMA PROCESSING APPARATUS AND PLASMA PROCESSING METHOD

[75] Inventors: Hitoshi Murayama, Soraku-gun; Toshiyasu Shirasuna, Nara; Ryuji Okamura, Soraku-gun; Kazuyoshi Akiyama, Nara; Takashi Ohtsuka, Kyotanabe; Kazuto Hosoi, Nara, all of Japan

[73] Assignee: Canon Kabushiki Kaisha, Tokyo, Japan

[21] Appl. No.: 09/157,933

[22] Filed: Sep. 22, 1998

[30] Foreign Application Priority Data

Sep. 24, 1997 [JP] Japan .................................. 9-258684

[51] Int. Cl.[7] .................................................. C23C 16/00
[52] U.S. Cl. ........................................ 118/723 E; 118/729
[58] Field of Search ................................ 118/723 E, 715, 118/716, 729, 730, 50.1

[56] References Cited

U.S. PATENT DOCUMENTS 4,676,195  6/1987  Yasui et al. ..................... 118/723 E
5,582,648  12/1996  Katagiri et al. ..................... 118/723

FOREIGN PATENT DOCUMENTS 62-4872    1/1987   Japan .................................. 118/723 E
62-133074  6/1987   Japan .................................. 118/723 E
6287760    10/1994  Japan .
8253865    10/1996  Japan .

*Primary Examiner*—Shrive Beck
*Assistant Examiner*—P. Hassanzodel
*Attorney, Agent, or Firm*—Fitzpatrick, Cella, Harper & Scinto

[57] ABSTRACT

For permitting increase in productivity and improvement in uniformity and reproducibility of characteristics of deposited films while maintaining good film characteristics, a plasma processing apparatus is constructed in such structure that a plurality of cylindrical substrates are set in a depressurizable reaction vessel and that a source gas supplied into the reaction vessel is decomposed by a high frequency power introduced from a high frequency power introducing means to generate a plasma to permit deposited film formation, etching, or surface modification on the cylindrical substrates, wherein the plurality of cylindrical substrates are placed at equal intervals on the same circumference and wherein the high frequency power introducing means is provided outside the placing circumference for the cylindrical substrates.

61 Claims, 12 Drawing Sheets

PLASMA PROCESSING APPARATUS AND PLASMA PROCESSING METHOD

BACKGROUND OF THE INVENTION

1. Field of the Invention

The present invention relates to a plasma processing apparatus that can be used as a deposited film forming apparatus for forming a deposited film on a substrate and to a plasma processing method that can be applied to a deposited film forming method. More particularly, the invention relates to a plasma processing apparatus used in forming a functional film, particularly a deposited film suitably used in semiconductor devices, photosensitive members for electrophotography, sensors for input of image, photographing devices, photovoltaic devices, and so on, and to a plasma processing method that can be applied to the formation of such a deposited film.

2. Related Background Art

There are many conventional methods including vacuum evaporation, sputtering, ion plating, thermal CVD, photo CVD, plasma CVD, and so on as methods for forming deposited films used in the semiconductor devices, photosensitive members for electrophotography, line sensors for input of image, photographing devices, photovoltaic devices, other various electronic devices, and optical elements, and apparatus therefor are also in practical use.

Among them the plasma CVD, which is a method for decomposing a source gas by a dc or high frequency or microwave glow discharge to form a thin deposited film on a substrate Plasma CVD is now in practical use as a favorable method for forming a deposited film of hydrogenated amorphous silicon (hereinafter referred to as "a-Si:H") used in photosensitive members for electrophotography or the like, and a variety of apparatuses therefor have been proposed heretofore.

The outline of the deposited film forming apparatus and forming method of this type will be described below.

FIG. 1 is a schematic, structural view to show an example of the deposited film forming apparatus by the RF plasma CVD process (hereinafter abbreviated as "RF-PCVD") using the frequency in the RF band as a power source, specifically, it is an example of an apparatus for forming a light receiving member for electrophotography. The structure of the forming apparatus shown in FIG. 1 is as follows.

This apparatus is principally composed of a deposition device 2100, a source gas supply device 2200, and an evacuation device (not illustrated) for depressurizing the inside of a reaction vessel 2101. Inside the reaction vessel 2101 in the deposition device 2100 there are a cylindrical substrate 2112, a substrate support 2113 internally provided with a heater for heating the substrate, and source gas inlet pipes 2114, and a high frequency matching box 2115 is connected to a cathode electrode 2111 composing a part of the reaction vessel 2101. The cathode electrode 2111 is insulated from the ground potential by insulators 2120 and a high frequency voltage can be applied between the cathode electrode 2111 and the cylindrical substrate 2112 also serving as an anode electrode while being maintained at the ground potential through the substrate support 2113.

The source gas supply device 2200 is composed of cylinders 2221 to 2226 of source gases such as $SiH_4$, $GeH_4$, $H_2$, $CH_4$, $B_2H_6$, $PH_3$, etc., valves 2231 to 2236, 2241 to 2246, 2251 to 2256, and mass flow controllers 2211 to 2216, each source gas cylinder being connected through a valve 2260 to the gas inlet pipes 2114 in the reaction vessel 2101.

Formation of a deposited film using this apparatus can be carried out as follows using a cylindrical substrate such as a photosensitive member for electrophotography.

First, the cylindrical substrate 2112 is set in the reaction vessel 2101 and the inside of the reaction vessel 2101 is evacuated by an unrepresented evacuation device (for example, a vacuum pump). In the subsequent step, the temperature of the cylindrical substrate 2112 is controlled to a predetermined temperature of 200° C. to 350° C. by the heater for heating the substrate provided in the substrate support 2113.

For allowing the source gas for formation of a deposited film to flow into the reaction vessel 2101, the following operations are carried out; after checking that the valves 2231 to 2236 of the gas cylinders and a leak valve 2117 of the reaction vessel are closed and further that the inflow valves 2241 to 2246, outflow valves 2251 to 2256, and auxiliary valve 2260 are opened, a main valve 2118 is first opened to evacuate the inside of the reaction vessel 2111 and a gas pipe 2116.

When the reading of a vacuum gage 2119 reaches about $7 \times 10^{-4}$ Pa, the auxiliary valve 2260 and outflow valves 2251 to 2256 are closed.

Then the valves 2231 to 2236 are opened to introduce the gases from the gas cylinders 2221 to 2226 and the pressure of each gas is adjusted to 2 kg/cm$^2$ by pressure adjuster 2261 to 2266. Then the inflow valves 2241 to 2246 are gradually opened to introduce each gas into the associated mass flow controller 2211 to 2216.

After completion of the preparation for film formation as described above, formation of each layer is carried out according to the following procedures.

When the cylindrical substrate 2112 reaches a desired temperature, necessary valves out of the outflow valves 2251 to 2256, and the auxiliary valve 2260 are gradually opened to introduce desired gases from the gas cylinders 2221 to 2226 through the gas inlet pipes 2114 into the reaction vessel 2101. Then the flow rate of each source gas is adjusted to a predetermined value by the mass flow controller 2211 to 2216. On that occasion the aperture of the main valve 2118 is controlled while checking the vacuum gauge 2119 so that the pressure in the vacuum vessel 2101 becomes a predetermined value. After the internal pressure becomes stable, an RF power source (not illustrated) of the frequency 13.56 MHz is set to a desired power and the RF power is guided through the high frequency matching box 2115 and cathode 2111 into the reaction vessel 2101, thus inducing a glow discharge with the cylindrical substrate 2112 acting as an anode. This discharge energy decomposes the source gases introduced into the reaction vessel and a desired deposited film comprising silicon as a main component is formed on the cylindrical substrate 2112. After the deposited film is formed in a desired thickness, the supply of RF power is stopped and the outflow valves are closed to stop the flow of the gases into the reaction vessel, thus terminating the formation of the deposited film.

By repetitively carrying out the operation similar to the above several times, a light receiving layer can be formed in a desired multilayer structure.

It is a matter of course that all the other outflow valves than those for necessary gases are closed during formation of each layer. In order to avoid the gas from remaining in the reaction vessel 2101 and in the pipes from the outflow valves 2251 to 2256 to the reaction vessel 2101, the operation to close the outflow valves 2251 to 2256, to open the auxiliary valve 2260, and to fully open the main valve 2118 to evacuate the inside of the system once to a high vacuum is carried out as occasion may demand.

In order to make the film formation uniform, it is also effective to rotate the cylindrical substrate 2112 at a desired rate by a driving device (not illustrated) during the layer formation.

Further, the gas species and valve operations described above are modified according to production conditions of each layer.

In addition to the deposited film forming apparatus and forming method by the RF plasma CVD process using the frequency in the above RF band as described above, the VHF plasma CVD (hereinafter abbreviated as "VHF-PCVD") process using the high frequency power in the VHF band is also drawing attention in recent years. Development of various deposited film forming apparatuses using VHF-PCVD is also active. This is because the VHF-PCVD process is expected to be able to achieve reduction of cost and enhancement of quality of products because of its high film deposition rate and capability of forming a high-quality deposited film. For example, Japanese Patent Application Laid-Open No. 6-287760 discloses an apparatus and method capable of being used in formation of an a-Si-based light receiving member for electrophotography. Development is also in progress of the deposited film forming apparatus that can simultaneously form a plurality of light receiving members for electrophotography and that has very high productivity, as shown in FIGS. 2A and 2B.

FIG. 2A is a schematic, longitudinal cross sectional view and FIG. 2B is a schematic, transverse cross sectional view taken along line 2B—2B of FIG. 2A. An exhaust pipe 2311 is integrally formed in a side face of a reaction vessel 2301 and the other end of the exhaust pipe 2311 is connected to an unrepresented evacuation device. Six cylindrical substrates 2305 on which the deposited film is to be formed are placed with their center axes being parallel to each other so as to surround the central part of the reaction vessel 2301. Each cylindrical substrate 2305 is held by a rotation shaft 2308 and is arranged to be heated by a heat-generating member 2307. When motors 2309 are actuated, the rotation shafts 2308 start rotating through a reduction gear system 2310, so that the cylindrical substrates 2305 start rotating on their center axis extending in the direction of the generating line.

A source gas is supplied from source gas supplying means 2312 through their source gas discharge ports (not illustrated) into a film-forming space 2306 surrounded by the six cylindrical substrates 2305. The VHF power is supplied from a VHF power source 2303 via a matching box 2304 and through a cathode electrode 2302 to the film-forming space 2306. On this occasion, the cylindrical substrates 2305 are maintained at the ground potential through the rotation shafts 2308 which act as anode electrodes.

Formation of deposited films using the apparatus described above is carried out according to the following procedures.

First, the cylindrical substrates 2305 are set in the reaction vessel 2301 and the inside of the reaction vessel 2301 is evacuated through the exhaust pipe 2311 by an evacuation device not illustrated. Subsequently, the cylindrical substrates 2305 are heated to and controlled at a desired temperature in the temperature range of about 200° C. to 300° C. by the heat generators 2307.

When the cylindrical substrates 2305 reach the desired temperature, the source gas is introduced through the source gas supplying means 2312 into the reaction vessel 2301. After checking that the flow rate of the source gas reaches a set value and that the pressure inside the reaction vessel 2301 becomes stable, a predetermined VHF power is supplied from the high frequency power source 2303 through the matching box 2304 to the cathode electrode 2302. This causes the VHF power to be introduced between the cathode electrode 2302 and the cylindrical substrates 2305 also serving as anode electrodes, thus inducing the glow discharge in the film-forming space 2306 surrounded by the cylindrical substrates 2305. The glow discharge excites and dissociates the source gas to form the deposited films on the cylindrical substrates 2305.

After the deposited films are formed in a desired thickness, the supply of the VHF power is stopped and then the supply of the source gas is also stopped, thus terminating the formation of deposited films. By repetitively carrying out the operation similar to the above several times, the light receiving layers are formed in the desired multilayer structure.

During the formation of deposited films the cylindrical substrates 2305 are rotated at a desired rate through the rotation shafts 2308 by the motors 2309, whereby the deposited films are formed throughout the entire circumference for the surfaces of the cylindrical substrates.

Further, Japanese Patent Application Laid-Open No. 8-253865 discloses the technology for simultaneously forming deposited films on a plurality of substrates by use of a plurality of electrodes and describes that the technology can enhance productivity and enhance uniformity of the characteristics of deposited films. Such an apparatus is shown in FIGS. 3A and 3B.

FIG. 3A is a schematic, longitudinal cross sectional view and FIG. 3B is a schematic, transverse cross sectional view taken along line 3B—3B of FIG. 3A. An exhaust port 2505 is integrally formed in an upper face of a reaction vessel 2500 and the other end of the exhaust pipe is connected to an evacuation device not illustrated. A plurality of cylindrical substrates 2501 on which the deposited film is to be formed are arranged in parallel to each other in the reaction vessel 2500. Each cylindrical substrate 2501 is held by a rotation shaft 2506 and is arranged to be heated by a heat generator 2507. The cylindrical substrates 2501 are rotated on their own axes of rotation of the shafts 2506 by driving means such as a motor not illustrated, as occasion may demand.

The VHF power is supplied from a high frequency power source 2503 via a matching box 2504 and then through cathode electrodes 2502 into the reaction vessel 2500. On this occasion, the cylindrical substrates 2501 are maintained at the ground potential through the shafts 2506 which act as anode electrodes.

The source gas is supplied into the reaction vessel 2500 through an unrepresented source gas supply means set in the reaction vessel 2500.

The formation of deposited films using the apparatus described above can be carried out according to procedures similar to those in the case of the deposited film forming apparatus shown in FIGS. 2A and 2B.

Relatively good deposited films can be formed by the methods and apparatus described above. Market demand for products using these deposited films is, however, becoming higher and higher and, in order to meet this demand, deposited films with higher quality are desired.

For example, in the case of the electrophotographic apparatus, there are very strong desires for an increase in copying speed, downsizing of the electrophotographic apparatus, and lowering of price. In order to satisfy these desires, it is indispensable to enhance the characteristics of the photosensitive member, specifically enhance chargeability, sensitivity, etc., and reduction of the production cost of the photosensitive member. Further, in the digital electrophotographic devices and color electrophotographic devices which are becoming quickly widespread in recent years, stronger desire than before exists for enhancement of the characteristics of the photosensitive member, including decrease in unevenness of image density, decrease of optical memory, and so on, because they are frequently used for copies of photographs, pictures, design images, etc. as well as character documents. Optimization of the deposited film forming conditions and the layer stacking structure of deposited films is sought in order to enhance the characteristics of the photosensitive member and reduction of production cost of the photosensitive member as described above, but, at the same time, improvement is also strongly demanded in the deposited film forming apparatus and deposited film forming method.

Thus, the deposited film forming apparatus and deposited film forming methods described previously are still susceptible to enhancement of the characteristics of deposited films and in reduction of the deposited film forming cost.

Specifically, examples of such improvement include decrease of substrate-processing time by increase of film deposition rate, increase of the number of simultaneously processable substrates, and so on. These will considerably contribute to enhancing productivity and reducing the production cost, particularly in the case where the deposited films formed are thick, as in the case of forming an electrophotographic, photosensitive member.

Further, the apparatus and methods described previously are also susceptible to improvement in uniformity and reproducibility of the characteristics of deposited films formed. Inadequate uniformity and reproducibility of the characteristics of deposited films will result in variation in the characteristics of deposited films and in turn degrade the quality of products and lower the percentage of non-defective products. Particularly, in the case of forming a member of a stacked structure of a plurality of deposited films, if this characteristic variation degrades the film characteristics of a certain layer, matching with the other layers will also be degraded and thus the entire member will be greatly affected. Further, in the case of a large-area member such as the electrophotographic, photosensitive member, even if degradation of the film quality occurs locally, removing only that portion is not possible, and thus the influence thereof will be considerable. As described above, enhancing uniformity and reproducibility of the characteristics of deposited films and suppressing variation in the characteristics of deposited films will greatly contribute to enhancing overall characteristics of the deposited films and to the reduction of the deposited film forming cost.

As described above, a deposited film forming apparatus and deposited film forming method capable of improving film deposition rate, increasing the number of simultaneously processable substrates, and enhancing uniformity and reproducibility of the characteristics of deposited films, will make it possible to achieve enhanced quality of products and the reduction of production cost. These advances are necessary and indispensable for meeting the current market demand.

Incidentally, such high-speed processing, enhanced uniformity and reproducibility, and decreased of production cost are also demanded not only for the formation of deposited films using a plasma, but also for etching, surface modification, or the like using a plasma.

SUMMARY OF THE INVENTION

An object of the present invention is to solve the above problems.

Specifically, an object of the present invention is to provide a plasma processing apparatus and a plasma processing method having an increased processing speed, the increased number of simultaneously processable substrates, and excellent uniformity and reproducibility.

Another object of the present invention is to provide a plasma processing apparatus and a plasma processing method that can achieve improvement in quality and a decrease in production cost.

Still another object of the present invention is to provide a plasma processing apparatus and a plasma processing method that can achieve an increase of productivity and enhancement of uniformity and reproducibility of the processing characteristics while maintaining good processing characteristics (for example, the film characteristics) in the plasma processing typified by the formation of deposited films, which comprises setting a plurality of cylindrical substrates in a depressurizable reaction vessel and decomposing a source gas supplied into the reaction vessel by a high frequency power introduced through a high frequency power introducing means to form deposited films on the plurality of cylindrical substrates.

Still another object of the present invention is to achieve a decrease in the deposited film forming time and an increase in utilization efficiency of the source gas, to reduce overall production cost, and to reduce the cost of various devices necessitating film deposition, such as semiconductor devices and light receiving members for electrophotography, sensors for input of images, optical elements, and so on, with excellent characteristics.

According to an aspect of the present invention, a plasma processing apparatus is provided in which a plurality of cylindrical substrates can be set in a depressurizable reaction vessel. A source gas supplied into the reaction vessel is decomposed by a high frequency power introduced through a high frequency power introducing means to effect plasma processing on the plurality of cylindrical substrates. The plasma processing apparatus has a mount portion for placing the plurality of cylindrical substrates at equal intervals on the same circumference, wherein the high frequency power introducing means is set at least outside the placing circumference for the plurality of cylindrical substrates.

According to another aspect of the present invention, there is provided a plasma processing method, comprising setting a plurality of cylindrical substrates in a depressurizable reaction vessel and decomposing a source gas supplied into the reaction vessel by a high frequency power to effect plasma processing on the plurality of cylindrical substrates. The plurality of cylindrical substrates are placed at equal intervals on the same circumference. The high frequency power is introduced from at least outside the placing circumference for the plurality of cylindrical substrates to effect the plasma processing.

DETAILED DESCRIPTION OF THE PREFERRED EMBODIMENTS

The inventors have conducted intensive and extensive studies in order to accomplish the above objects and have first found that in the deposited film forming apparatus and deposited film forming method, the method of placing the substrate and the method of introducing the high frequency power profoundly affect the characteristics of deposited films, the uniformity and reproducibility of the characteristics of deposited films, and the productivity of deposited films. Further, the inventors have found that by placing the cylindrical substrates at equal intervals on one and the same circumference (or circle) and introducing the high frequency power from outside the circumference for the placement (simply referred to as placing circumference) for the cylindrical substrates, deposited films with good characteristics can be formed uniformly with high reproducibility and at a high film deposition rate on a plurality of substrates, thus accomplishing the present invention.

According to the present invention as described above, it is possible to form deposited films with good characteristics to be formed uniformly with high reproducibility and at a high film deposition rate on a plurality of substrates.

The present invention to achieve such effects will be described in detail.

The term "cylindrical substrate" as used in the specification and claims should not be limited to the cylindrical substrate in a narrow sense but also includes column-like substrates or those of all shapes applicable in the scope of the spirit of the invention.

In the present invention, the cylindrical substrates are placed at equal intervals on the same circumference and the high frequency power is introduced outside the placing circumference for the cylindrical substrates, whereby a plasma can be created which has a sufficient density not only outside the placing circumference but also inside the placing circumference.

This effect is considered to be achieved for the following reasons. When the high frequency power is introduced from outside the placing circumference for the cylindrical substrates placed on the same circumference, the high frequency power supplies energy to the plasma induced outside the placing circumference and at the same time propagates while attenuating toward the inside of the placing circumference. On the other hand, since the volume of discharge space per unit radial length decreases toward the inside of the placing circumference, the attenuation of the power is canceled out by the decrease of the volume of discharge space, whereby a plasma with a sufficient density can be maintained also inside the placing circumference.

Figure 1:
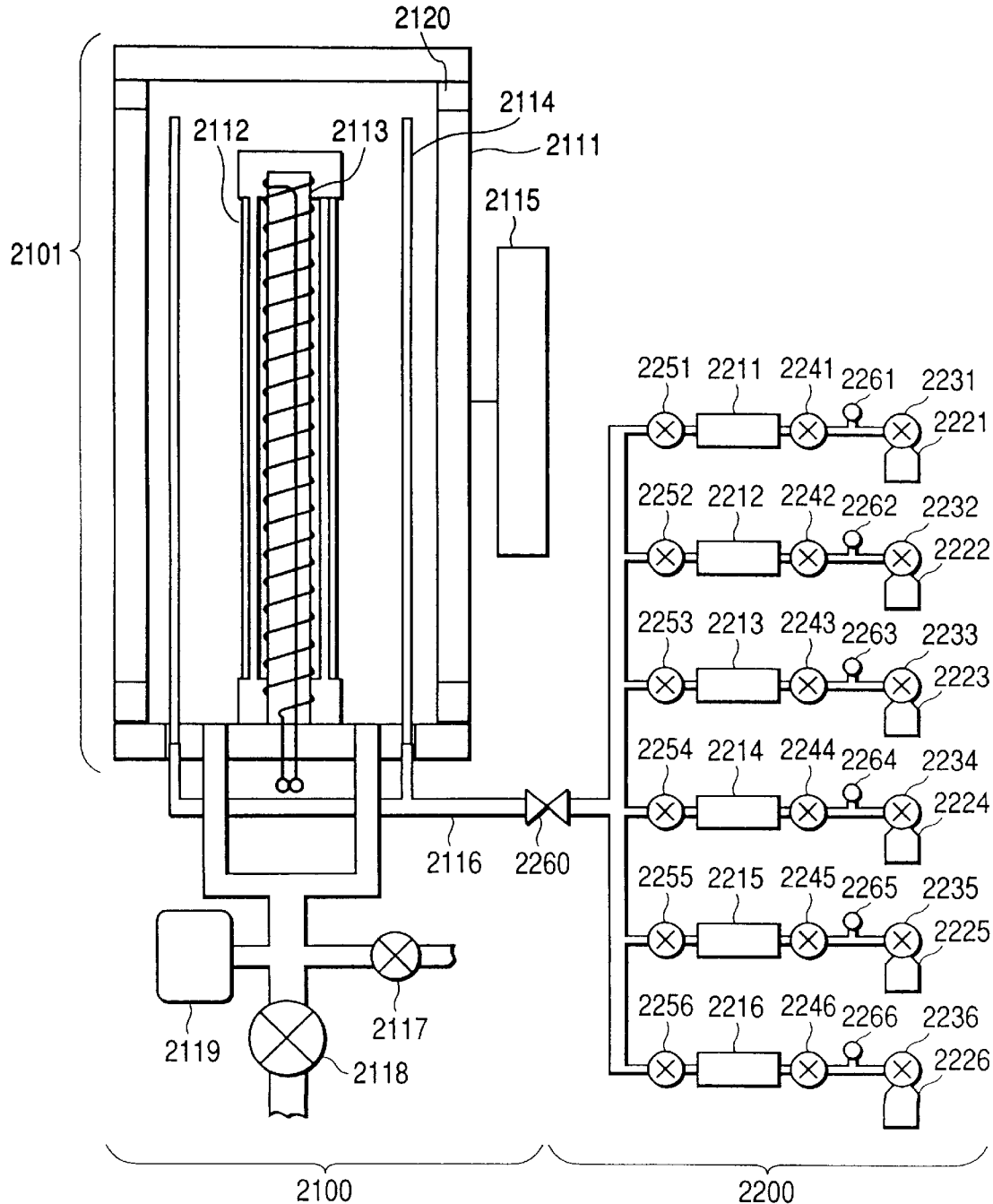
FIG. 1 is a schematic, longitudinal, sectional view for explaining an example of the deposited film forming apparatus.
Figure 2A:
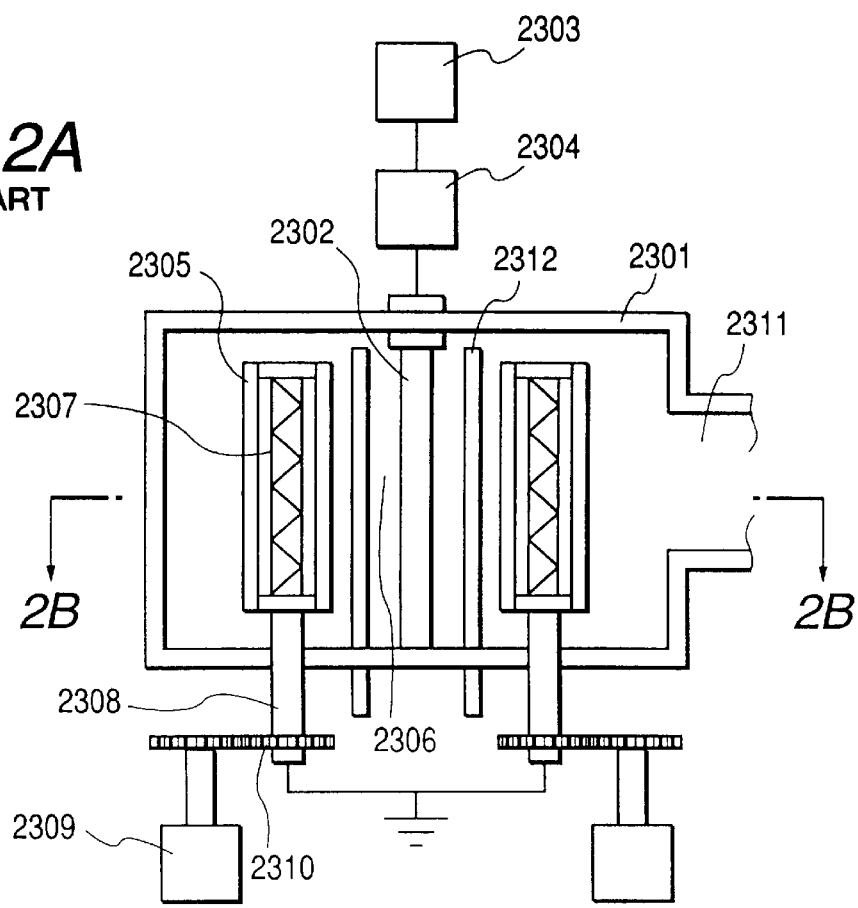
FIG. 2A is a schematic, longitudinal, sectional view for explaining another example of the deposited film forming apparatus.
Figure 2B:
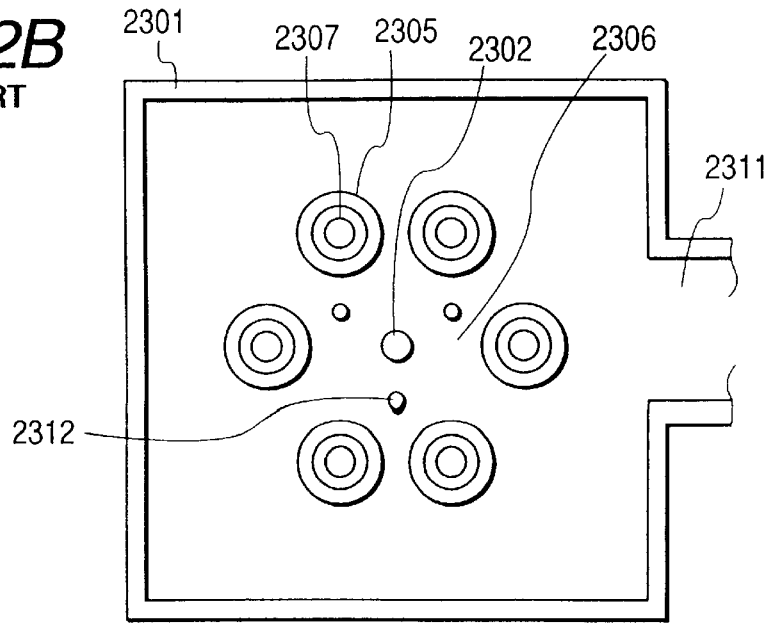
FIG. 2B is a transverse, sectional view taken along line 2B—2B of FIG. 2A for explaining the example of the deposited film forming apparatus.

In contrast, for example in the case illustrated in FIGS. 2A and 2B, the high frequency power introducing means (cathode electrode 2302) is placed only inside the placing circumference for the cylindrical substrates, the high frequency power supplies the energy to the plasma induced inside the placing circumference and at the same time propagates while attenuating toward the outside of the placing circumference. On the other hand, since the volume of discharge space per unit radial length increases toward the outside of the placing circumference, and since the synergistic effect of the attenuation of the power and the increase of the volume of discharge space makes the power density outside the placing circumference for cylindrical substrates considerably smaller than the power density inside the placing circumference, it may become difficult to create and maintain a plasma with a sufficient density.

Since in the present invention a plasma with a sufficient density can be readily created not only outside the placing circumference but also inside the placing circumference as described above, the film formation can be carried out at the same time throughout the entire circumference for the cylindrical substrates. This achieves a great increase in the average film deposition rate across the entire circumference for the substrates and a great decrease in the deposited film forming time, as compared with the apparatus as shown in FIGS. 2A and 2B for film formation only on parts of the cylindrical substrates and forming the film over the entire circumference for the substrates by rotating the cylindrical substrates.

Further, the present invention achieves an increase of the film deposition rate as described above and also permits variation in the film characteristics among the substrates to be suppressed adequately while maintaining the film characteristics at a high level. The mechanism of suppressing the variation in the film characteristics still remains to be fully elucidated at present, but the schematic mechanism is presumed as follows.

The plasma has different characteristics, specifically different energy distribution of electrons in particular, in the vicinity of a wall surface in contact therewith from those in the other regions. This is due to emission of high-energy electrons from the wall surface in contact with the plasma. Namely, the plasma maintains a positive potential with respect to the wall surface in contact therewith, so that an electric field according to this potential difference appears in the boundary region between the plasma and the wall surface (i.e., in the so-called "sheath area"). This accelerates the positive ions incident to the wall surface from the plasma in this sheath area, so that the positive ions come into collision with the wall surface while being kept in a high energy state. On this occasion electrons are emitted from the wall surface and are accelerated in the sheath area to go into a high energy state and to enter the plasma. This results in making the percentage of high-energy electrons higher in the vicinity of the wall surface than those in the other regions and thus making the kinds or percentage of active species created there different from those in the other regions.

When a deposited film is formed on a substrate, the surface of the substrate itself serves as the wall surface described above. When a plurality of cylindrical substrates are placed, the distribution of plasma regions with a high percentage of high-energy electrons differs depending upon the way of placement of the substrates accordingly. If the shapes of this distribution against the cylindrical substrates are different among the cylindrical substrates, the kinds and percentages of the active species reaching the respective cylindrical substrates will become different from one another as described above and variation in the characteristics of deposited films formed by those active species will also occur readily among the substrates.

Since in the present invention the cylindrical substrates are placed at equal intervals on the same circumference, all the distribution shapes of the plasma regions with a high percentage of high-energy electrons against the respective cylindrical substrates are the same and the kinds and percentages of the active species reaching the substrates are also the same on all the substrates. As a result, the characteristics of the deposited films formed on the cylindrical substrates are also good without variation in the characteristics among the substrates.

As described above, the present invention permits both the decrease of the deposited film forming time and suppression of characteristic variation among the cylindrical substrates to be achieved on the occasion of concurrent formation of deposited films on a plurality of cylindrical substrates.

The present invention also achieves further outstanding effects by the following configurations and methods. Each will be detailed below.

First, in the present invention, when a high frequency power is introduced from a plurality of high frequency power introducing means, the effect of suppressing the characteristic variation among the cylindrical substrates is further enhanced by placing the plurality of high frequency power introducing means at equal intervals on a concentric circle having the same center as the placing circumference for the cylindrical substrates.

This is because the surfaces of the high frequency power introducing means also work as wall surfaces in the plasma and affect the characteristics of the deposited films to be formed, for the reason as mentioned above. Accordingly, by placing the high frequency power introducing means at equal intervals on the concentric surface having the same center as the placing circumference for the cylindrical substrates, their influence on each substrate is made uniform and the difference between deposited films is suppressed among the substrates.

From the aspect of making the influence of the high frequency power introducing means uniform on each substrate, the number of high frequency power introducing means is more preferably equal to the number of the cylindrical substrates or half of the number of the cylindrical substrates. When the number of high frequency power introducing means is half the number of the cylindrical substrates, the optimum placement is such that the high frequency power introducing means are arranged each at a location apart by an equal distance from the two cylindrical substrates adjacent thereto.

Second, the present invention can also achieve a further effect by placing a second high frequency power introducing means inside the placing circumference for the cylindrical substrates. The second high frequency power introducing means enhances controllability of the plasma inside the placing circumference for the cylindrical substrates, whereby more uniform and better deposited films can be formed throughout the entire circumference in the circumferential direction of the cylindrical substrates. When the cylindrical substrates are rotated, very excellent deposited films are always formed continuously as well to improve the characteristics of the deposited films to suppress the characteristic variation among lots or among the substrates.

From the aspect of averaging the influence on each cylindrical substrate, it is also preferable to set the second high frequency power introducing means at the center of the placing circumference for the cylindrical substrates or to place a plurality of second high frequency power introducing means at equal intervals on a concentric circle having the same center as the placing circumference for the cylindrical substrates. Such placement further suppresses the variation in the characteristics of deposited films among the substrates.

Further, by making the high frequency power introduced from the first high frequency power introducing means set outside the placing circumference for the cylindrical substrates and the high frequency power introduced from the second high frequency power introducing means independently controllable, it becomes possible to precisely control the film characteristics in the circumferential direction of the cylindrical substrates, which permits improvement of the film characteristics and further suppression of the variation in the film characteristics.

Further, by making the oscillation source of the high frequency power introduced from the first high frequency power introducing means and that of the high frequency power introduced from the second high frequency power introducing means the same, the variation in the characteristics of deposited films formed is effectively suppressed among lots.

The cause of this effect is considered as follows. When different oscillation sources are used and when oscillation frequencies of the two power sources are not perfectly equal to each other, this deviation between the oscillation frequencies would cause changes in the phase difference during formation of deposited films or among lots of deposited films formed. It is considered that this phase difference would change the kinds and percentages of the active species generated in the plasma or would make the plasma unstable in certain cases.

In the present invention, by using the same oscillation source for both the high frequency power introduced from the first high frequency power introducing means and the high frequency power introduced from the second high frequency power introducing means, the phase difference can always be maintained constant, so that good deposited films can be formed on a stabler basis and with good reproducibility.

Third, in the present invention, by further employing such a configuration that a source gas is decomposed to carry out formation of deposited films inside a cylindrical wall provided such that it surrounds a plurality of cylindrical substrates and such that the center axis thereof passes the center of the placing circumference for the cylindrical substrates, a further outstanding effect can be achieved. Namely, this configuration permits high-level control of the variation in characteristics among the substrates while maintaining the high level of film characteristics of the deposited films formed. This effect is presumably based on the following two actions.

Figure 4:
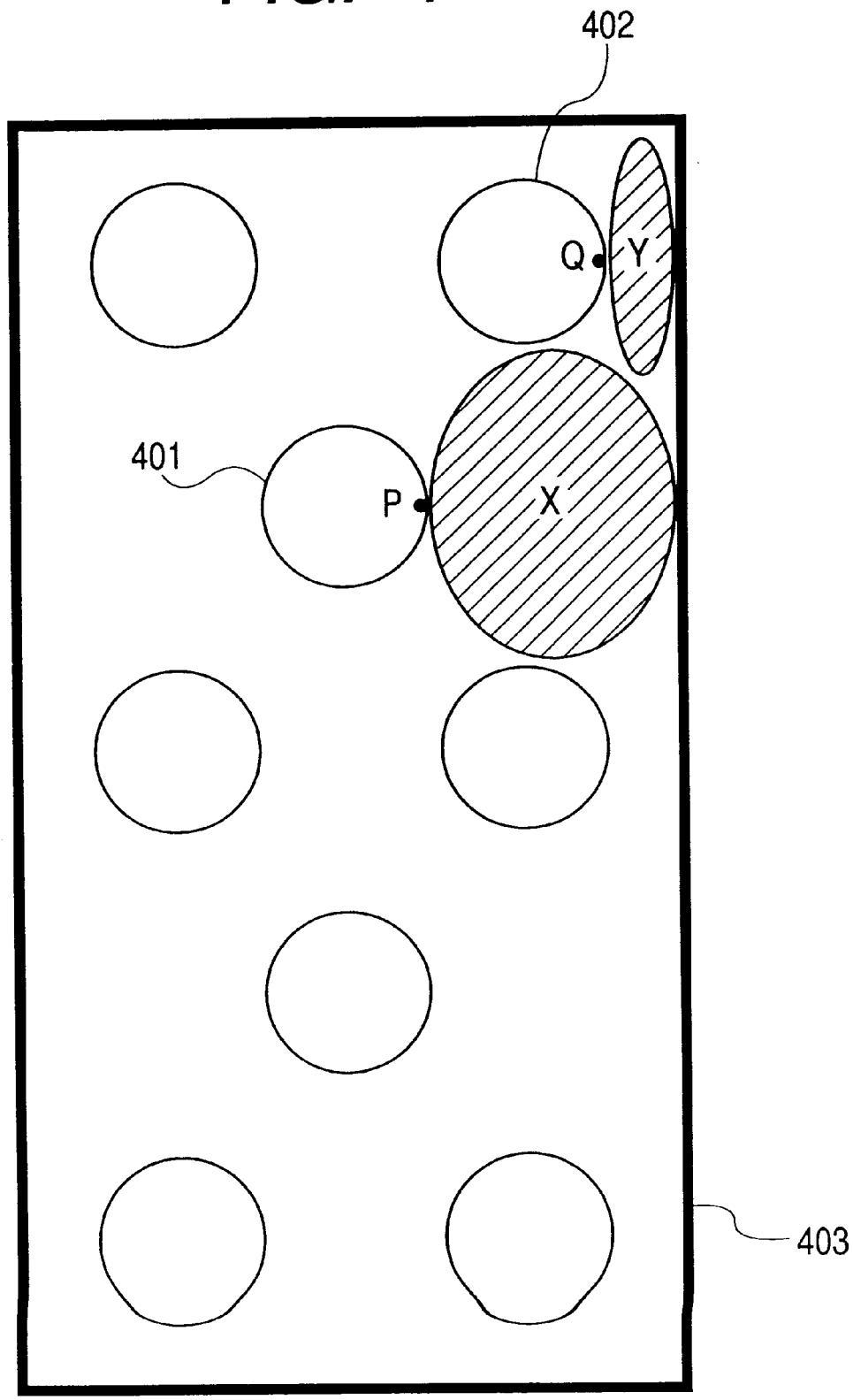
FIG. 4 is a schematic, transverse, sectional view for explaining one of the functions of the present invention.

The first action is caused by the configuration in which the distances between each cylindrical substrate and the wall surface of the film-forming space are made equal, that is, by the configuration in which the volumes of the film-forming spaces contributing to the film deposition on the respective cylindrical substrates are made equal. For example, in the case of the configuration as shown in FIG. 4, when comparison is made between point P on a cylindrical substrate A 401 and point Q on a cylindrical substrate B 402, the film-forming space X for supplying the active species to point P is greater than the film-forming space Y for supplying the active species to point Q. This results in a difference between amounts of active species reaching the substrates at point P and at point Q and in turn a difference between film deposition rates. Since the film characteristics depend on the film deposition rate, this difference in the film deposition rate causes a difference between the characteristics of the film formed on the cylindrical substrate A and the characteristics of the film formed on the cylindrical substrate B. In contrast, in the aforementioned configuration of the present invention, since the volume of the film-forming space X is equal to that of the film-forming space Y, the same amount of active species always reach all the substrates, thus bringing about no difference in the characteristics. In FIG. 4 numeral 403 denotes the wall of the film forming space.

The second action is caused by the configuration that the distances are equal between each cylindrical substrate and the wall surface of the film-forming space, per se. As stated previously, the plasma has different characteristics in the vicinity of the wall surface in contact therewith from those in the other regions and the kinds and percentages of the active species created there are also different from those in the other regions. When there is a difference in the distance between each cylindrical substrate and the wall surface of the film-forming space, there also occurs a difference in the arrival rate of the active species generated in the vicinity of the wall surface to the surfaces of substrates among the substrates, which would be a cause of characteristic variation among the substrates. In contrast, the configuration of the present invention is such that the distances are equal between each cylindrical substrate and the wall surface of the film-forming space and that the arrival rates of the active species generated in the vicinity of the wall surface to the substrate surfaces are equal among all the substrates. Thus permits high-level control of the variation in the characteristics of the deposited films formed.

Further, in the present invention, a further effect can also be achieved by a configuration for carrying out the formation of deposited films by decomposing the source gas inside the cylindrical wall as described above, at least a part of the cylindrical wall surface is comprised of a non-conductive material and the high frequency power is introduced outside the cylindrical wall surface. Namely, this configuration eliminates loss of the source gas due to film deposition on the high frequency power introducing means and thus increases the source gas utilization efficiency. As a result, the production cost can be decreased. Further, no peeling off of films occurs from the surface of the high frequency power introducing means during the formation of deposited films, which can decrease dust in the film forming space and suppress defects in the deposited films.

Fourth, the present invention, to further improving the characteristics of deposited films to provide source gas supplying means for supplying a source gas both inside and outside the placing circumference for the cylindrical substrates. This is based on the result of study that the location of supply of a source gas greatly affects the characteristics of deposited films in some cases. As the source gas is supplied from the source gas supplying means into the film forming space, the gas quickly spreads throughout the entire film forming space. However, also in this process, the source gas is decomposed by the high frequency power, so that the gas composition differs according to the distance from the source gas supply means. For example, in the case of the source gas of $SiH_4$, decomposition of $SiH_4$ advances more as the distance becomes larger from the source gas supply means. Thus $SiH_4$ decreases with increasing distance. Conversely, $H_2$ created by the decomposition of $SiH_4$ increases with increasing distance from the source gas supply means and, therefore, the characteristics of deposited films at locations apart from the source gas supply means become just like those resulting by use of the source gas of $SiH_4$ diluted with $H_2$. This phenomenon becomes particularly outstanding when the high frequency power is high or when the high frequency power used is in a frequency band with a high source gas decomposition efficiency. In the present invention, providing the source gas supply means for supplying the source gas both inside and outside the placing circumference for the cylindrical substrates substantially obviates the above-stated problem, whereby deposited films can be formed with objective characteristics in all the areas of all the cylindrical substrates.

Fifth, in the present invention, when the frequency of the high frequency power is within the range of 50 to 450 MHz, uniformity of the film characteristics in the circumferential direction of the cylindrical substrates becomes particularly high.

This is presumably because the pressure capable of stably creating a plasma increases suddenly in the frequency region lower than 50 MHz. According to the studies by the present inventors, for example when the frequency is 13.56 MHz, the pressure capable of stably creating a plasma is about one order to half order higher than that in the case of the frequencies not less than 50 MHz. At such a high pressure, particles of polysilane or the like are apt to be created in the film forming space. If such particles are incorporated into the deposited films, decreased will result. Such particles are likely to be generated particularly in the vicinity of the sheath. In the present invention there would be a possibility that use of such a low frequency may cause the incorporation of the particles into the films between adjacent cylinders. It is thus considered that the use of high frequency power not less than 50 MHz in the present invention prevents the incorporation of the particles into the films, whereby good deposited films are formed throughout the entire circumference of the cylindrical substrates.

Further, it is also considered that in the frequency region higher than 450 MHz, a difference in uniformity of the plasma would cause a difference in uniformity of the film characteristics, as compared with the case of 450 MHz or less. When the frequency is within the frequency region higher than 450 MHz, absorption of the power in the vicinity of the power introducing means is large and generation of electrons here is most frequent. Therefore, nonuniformity of the plasma occurs more easily, which will in turn result in unevenness of the characteristics of deposited films. At frequencies not more than 450 MHz, extreme power absorption is unlikely to occur in the vicinity of the power introducing means, so that the uniformity of the plasma, and thus of the film characteristics, becomes higher.

Figure 5A:
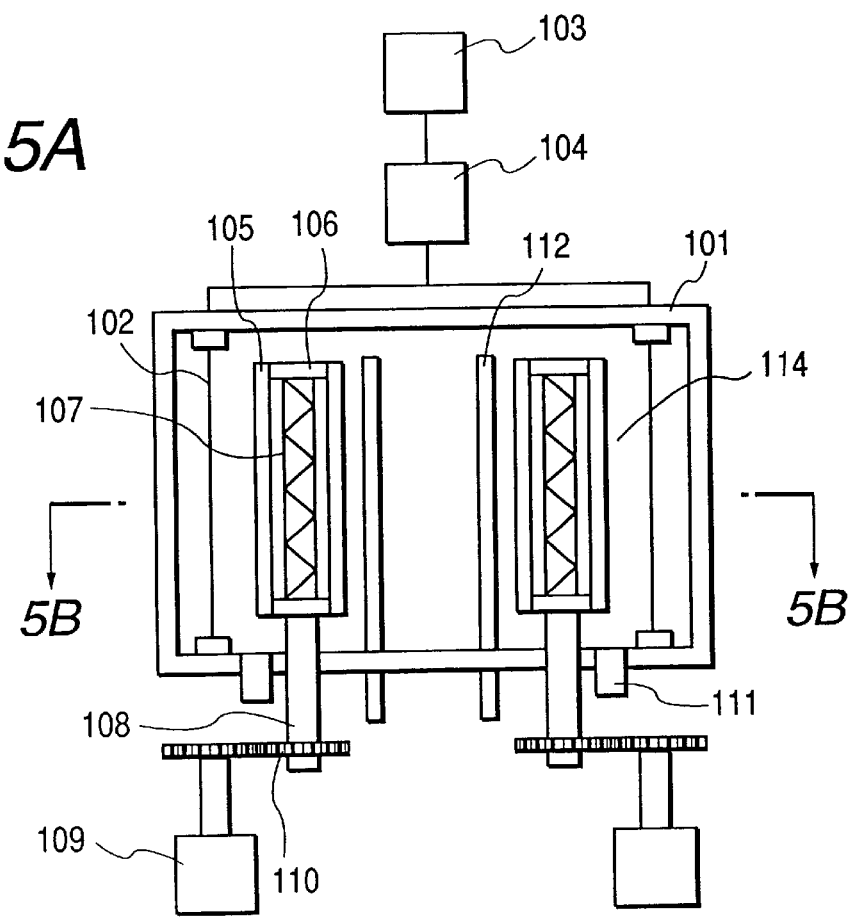
FIG. 5A is a schematic, longitudinal, sectional view for explaining another example of the deposited film forming apparatus.
Figure 5B:
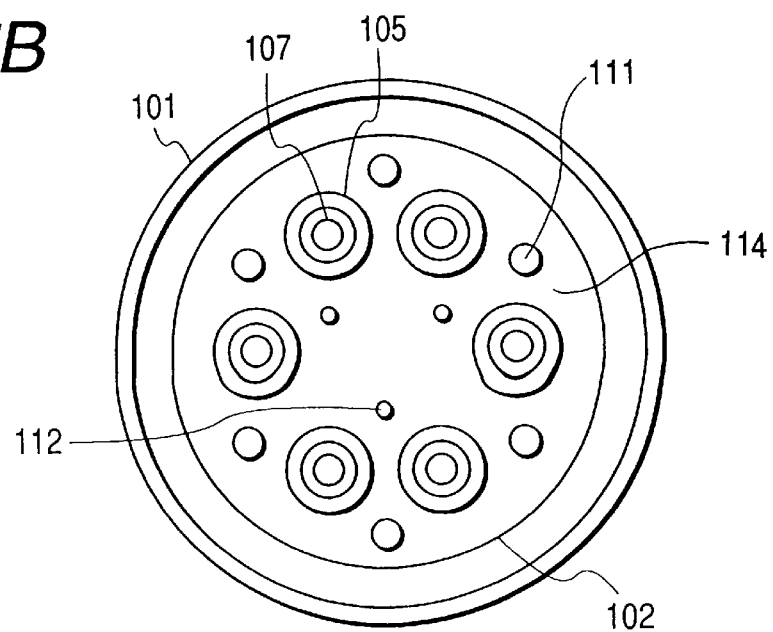
FIG. 5B is a transverse, sectional view taken along line 5B—5B of FIG. 5A for explaining the example of the deposited film forming apparatus.

The present invention will be described by reference to the drawings. FIGS. 5A and 5B are schematic, structural views to show an example of the deposited film manufacturing apparatus of a-Si based photosensitive members according to the present invention. FIG. 5A is a schematic, longitudinal, sectional view and FIG. 5B a schematic, transverse, sectional view taken along line 5B—5B of FIG. 5A.

Exhaust ports 111 are formed in the bottom surface of a reaction vessel 101 and the other ends of the exhaust pipes are connected to an evacuation device not illustrated. Cylindrical substrates 105 on which a deposited film is to be formed are placed in parallel to each other at equal intervals on the same circumference. Each substrate 105 is held by a rotation shaft 108. With actuation of motor 109 the rotation shaft 108 is rotated through a reduction gear system 110 to rotate the associated cylindrical substrate 105 on its center axis extending in the direction of the generating line thereof. Further, each cylindrical substrate 105 is arranged to be capable of being heated by a heat generator 107.

Outside the placing circumference for the cylindrical substrates 105 arranged on the same circumference, is provided a high frequency power introducing device 102, and the high frequency power outputted from the high frequency power source 103 is supplied via a matching box 104 and through the high frequency power introducing device 102 into a reaction vessel 101 which forms the film forming space.

Source gas supply means 112 are set inside the reaction vessel 101 and a desired source gas is supplied therethrough into the reaction vessel 101.

In the present invention there are no specific restrictions on the number of cylindrical substrates 105 placed on the same circumference but, in general, increase in the number of cylindrical substrates 105 will result in increase in the size of the apparatus and in the capacity of the high frequency power source needed. Therefore, the number of cylindrical substrates should be properly determined in consideration of these points.

Further, there are no specific restrictions on the shape of the high frequency power introducing means 102, but, from the viewpoint of preventing peeling off of films from the high frequency power introducing means 102, the means 102 is preferably constructed of a curved surface as far as possible. In the embodiment shown in the drawings, the cylindrical shape is particularly preferred from the aspect that the means 102 is located under the same conditions around the cylindrical substrates 105 placed on the same circumference. The supply of the high frequency power to the high frequency power introducing means 102 may be effected at a point on the high frequency power introducing means 102 or at a plurality of points thereon.

The surface of the high frequency power introducing means 102 is desirably subjected to roughening for the purpose of enhancing adhesion of films, preventing peeling off of films, and in turn restricting the dust during film formation. A specific degree of the roughening is preferably such that the ten-point mean roughness (Rz) with the reference length (L) of 2.5 mm falls within the range of 5–200 $\mu$m.

From the aspect of enhancing the adhesion of films, it is effective to further coat the surface of the high frequency power introducing means 102 with a ceramic material. There are no specific restrictions on specific means of coating, but the surface of the high frequency power introducing means 102 may be coated by a surface coating method such as the CVD process or flame spraying. Among the coating methods, the flame spraying is more preferable in terms of the cost or in terms of being less restricted by the size and shape of a coating object. Specific ceramic materials include alumina, titanium dioxide, aluminum nitride, boron nitride, zircon, cordierite, zircon-cordierite, silicon oxide, beryllium oxide, mica ceramics, and so on. There are no specific restrictions on the thickness of the ceramic material for coating the surface of the high frequency power introducing means 102, but the thickness is preferably 1 $\mu$m to 10 mm and more preferably 10 $\mu$m to 5 mm in terms of enhancement of durability and uniformity and in terms of absorbing amount of high frequency power and production cost.

Further, by providing the high frequency power introducing means 102 with a heating or cooling means, the adhesion of film can further be enhanced on the surface of the high frequency power introducing means 102 and peeling off of films can be prevented more effectively. In this case, whether the high frequency power introducing means 102 should be heated or cooled is properly determined depending upon the material for the deposited film and the deposition conditions. There are no specific restrictions on specific heating means as long as it is a heat generator. Specific examples of the heater include electric resistance heat generators such as a coil heater of a sheath heater, a plate-like heater, or a ceramic heater, thermal radiation lamp heat generators such as a halogen lamp or an infrared lamp, heat generators by a heat exchanger with a medium of liquid, gas, or the like, and so on. There are no specific restrictions on specific cooling means as long as it is a heat absorber. For example, specific cooling means may be a cooling coil, a cooling plate, a cooling cylinder, or the like that allows liquid or gas or the like to flow as a cooling medium.

The effects of the present invention can be achieved whatever the shape of the reaction vessel 101 is, but the wall surface thereof is preferably provided in such a configuration that the film forming space in which the source gas is decomposed is limited to a columnar region, as described previously. In this case, the reaction vessel 101 itself does not always have to be cylindrical, but, for example, a wall of the film forming space in a cylindrical shape may be provided inside the reaction vessel of a rectangular shape. When the film forming space is limited to the columnar region, the center axis of the columnar film forming space is arranged to pass the center of the placing circumference for the cylindrical substrates 101. For prevention of peeling off of films, it is effective to subject such a surface of the wall of the film forming space to roughening, coating with ceramics, and heating or cooling, as in the case with the surface of the high frequency power introducing means 102.

There are no specific restrictions on the number and the locations of placement of the source gas supplying devices 112, but an effective arrangement is such that the source gas supplying devices are set both inside and outside the placing circumference for the cylindrical substrates, as described previously.

The formation of deposited films using the apparatus described above is carried out, for example, schematically as follows.

First, the cylindrical substrates 105 held by respective substrate holders 106 are set in the reaction vessel 101 and the inside of the reaction vessel 101 is evacuated through the exhaust ports 111 by an evacuation device not illustrated. Subsequently, the cylindrical substrates 105 are heated to and controlled at a predetermined temperature by the heat generators 107.

After the cylindrical substrates 105 reach the predetermined temperature, the source gas is introduced through the source gas supplying devices 112 into the reaction vessel 101. After checking that the flow rate of the source gas reaches a set flow rate and that the pressure inside the reaction vessel 101 becomes stable, a predetermined high frequency power is supplied from the high frequency power source 103 via the matching box 104 to the cathode electrode 102. The high frequency power thus supplied induces a glow discharge in the reaction vessel 101 to excite and dissociate the source gas to thereby form a deposited film on each of the cylindrical substrates 105.

After the deposited films are formed in a desired thickness, the supply of the high frequency power is stopped and then the supply of the source gas is also stopped, thus terminating the formation of deposited films. For forming deposited films in a multilayer structure, the operation is repeated several times. In this case, the operation between layers may be carried out in such a manner that the discharge is completely stopped once at the time of completion of formation of one layer as described above, thereafter the gas flow rate and pressure are changed to set values thereof for the subsequent layer, and then discharge is again induced to form the subsequent layer or in such a manner that after completion of formation of one layer the gas flow rate, pressure, and high frequency power are gradually changed to set values thereof for the subsequent layer within a fixed time, thereby continuously forming plural layers.

During the formation of deposited films the cylindrical substrates 105 may be rotated at a predetermined rate through the rotation shafts 108 by the motors 109 as occasion may demand.

Figure 6A:
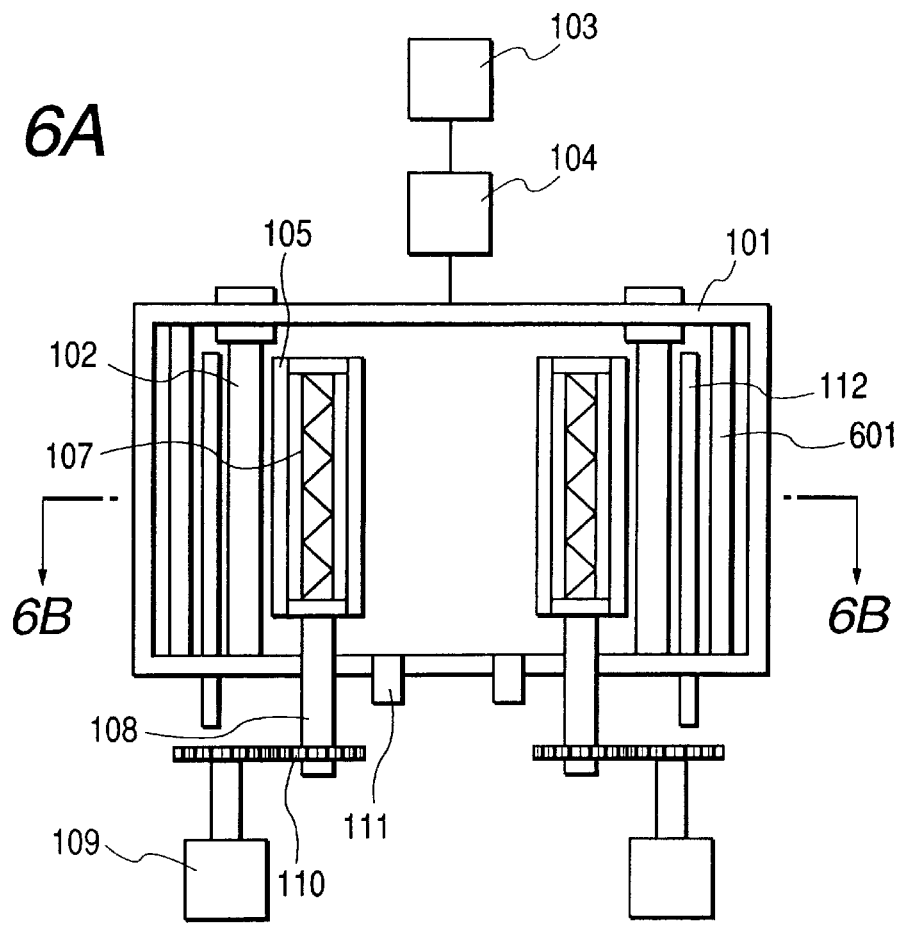
FIG. 6A is a schematic, longitudinal, sectional view for explaining another example of the deposited film forming apparatus.
Figure 6B:
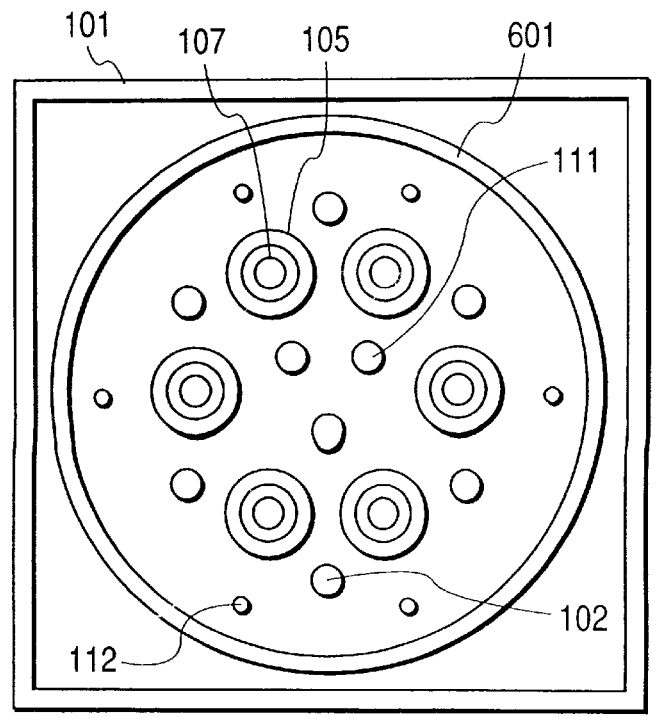
FIG. 6B is a transverse, sectional view taken along line 6B—6B of FIG. 6A for explaining the example of the deposited film forming apparatus.

In the present invention, a preferred configuration is such that a plurality of high frequency power introducing devices 102 are provided and are arranged at equal intervals on a concentric circle having the same center as the placing circumference for the cylindrical substrates 105 as illustrated in FIGS. 6A and 6B, for the purpose of restricting the characteristic difference of deposited films among the substrates. In this case, the number of high frequency power introducing devices is more preferably equal to the number of cylindrical substrates or half of the number of cylindrical substrates. When the number of devices 102 is half the number of cylindrical substrates, the optimum configuration is such that distances to the two adjacent cylindrical substrates are equal. Supply of a power to the plural high frequency power introducing devices 102 is effected, for example, in such a manner that a power source line is routed from one high frequency power source 103 through a matching box 104 and is then branched to the respective means as shown in FIG. 6A. Another example is such that a power source line from one high frequency power source 103 is branched to a plurality of matching boxes and the power is supplied through the matching boxes to the respective devices. A further example is such that each of the high frequency power introducing devices is provided with an individual high frequency power source and a matching box. It is, however, preferred that the power be supplied from one high frequency power source to all the high frequency power introducing means, in terms of perfect coincidence of frequencies of high frequency powers introduced from all the high frequency power introducing means, in terms of the cost of the apparatus, and in terms of the size of the apparatus.

The high frequency power introducing devices 102 may be cathode electrodes of a rod shape, a tubular shape, a spherical shape, a plate-like shape, or the like, or means constructed by providing an aperture in an outer conductor of a coaxial structure and arranged to supply the power therethrough, or the like. The high frequency power introducing devices 102 of such shapes are desirably constructed so that the surfaces of the high frequency power introducing devices 102 are roughened for the purpose of enhancing the adhesion of films, preventing the peeling off of films, and restricting the dust during film formation, as stated previously. A specific degree of the roughening is preferably such that the ten-point mean roughness (Rz) with the reference length (L) of 2.5 mm falls within the range of 5–200 $\mu$m.

Further, it is effective to coat the surfaces of the high frequency power introducing devices 102 of such shapes with a ceramic material as well in terms of enhancement of adhesion of films. There are no specific restrictions on specific means of coating, but, for example, a tubular member of a ceramic material or the like may be mounted so as to cover each high frequency power introducing means 102. Specific ceramic materials include alumina, titanium dioxide, aluminum nitride, boron nitride, zircon, cordierite, zircon-cordierite, silicon oxide, beryllium oxide, mica ceramics, and so on. The surfaces of the high frequency power introducing devices 102 may also be coated with either of the above materials by the surface coating method such as the CVD or flame spraying. Among the coating methods the flame spraying is more preferable in terms of the cost or because it is less limited by the size and shape of the coating object. There are no specific restrictions on the thickness of the ceramic material for coating the surfaces of the high frequency power introducing devices 102, but the thickness is preferably 1 $\mu$m to 10 mm and more preferably 10 $\mu$m to 5 mm in order to increase the durability and uniformity and also from the aspects of absorbing amount of high frequency power and production cost.

As illustrated in FIG. 6B, a cylindrical wall 601 is provided inside the reaction vessel 101 so as to surround the plurality of cylindrical substrates 105 and so that the center axis thereof passes the center of the placing circumference for the cylindrical substrates.

The formation of deposited films using the apparatus described above can also be carried out according to the procedures similar to those in the case of the apparatus shown in FIGS. 5A and 5B.

Figure 7A:
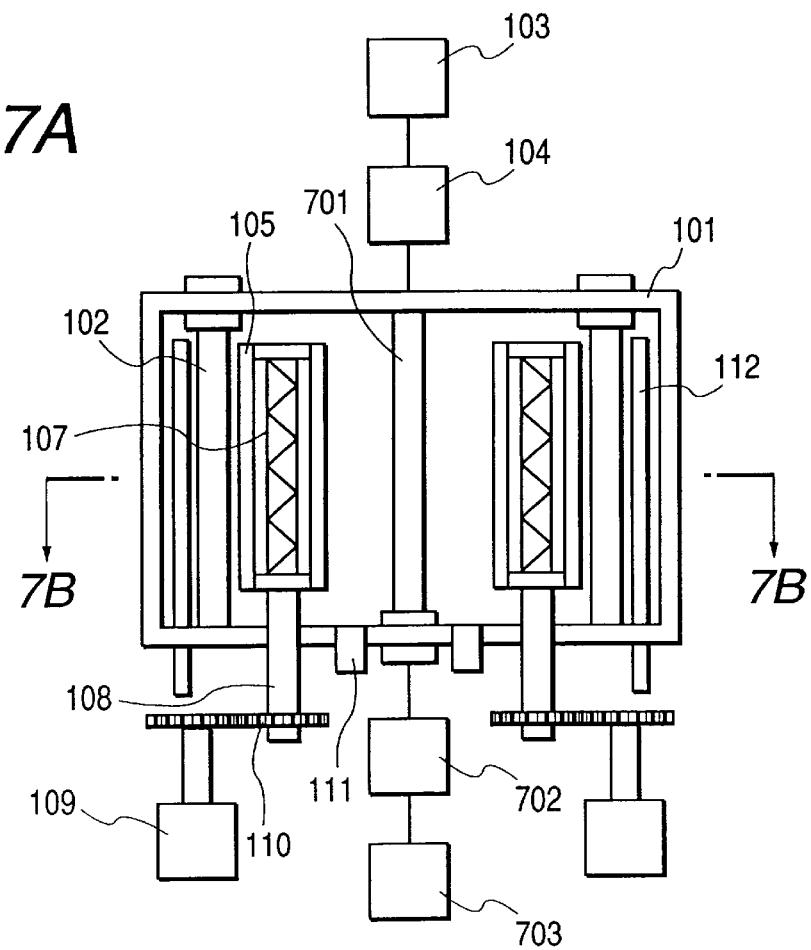
FIG. 7A is a schematic, longitudinal, sectional view for explaining another example of the deposited film forming apparatus.
Figure 7B:
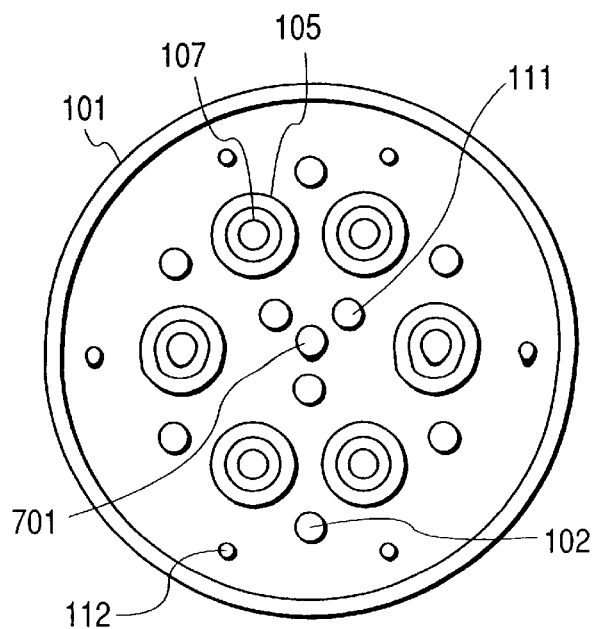
FIG. 7B is a transverse, sectional view taken along line 7B—7B of FIG. 7A for explaining the example of the deposited film forming apparatus.

Further, in the present invention, a more uniform and better deposited films can be formed throughout the entire circumference in the circumferential direction of each cylindrical substrate by providing a second high frequency power introducing means inside the placing circumference for the cylindrical substrates, as illustrated in FIGS. 7A and 7B. In FIGS. 7A and 7B, reference numeral 701 designates the second high frequency power introducing means, 702 a second matching box, and 703 a second high frequency power source.

The shape, size, surface property, power supplying method, etc. of the second high frequency power introducing device 701 can be determined to be similar to those of the high frequency power introducing devices 102. The shape, size, surface property, power supplying method, etc. of the second high frequency power introducing device 701 may be either completely the same as or different from those of the high frequency power introducing devices 102.

When a single second high frequency power introducing device 701 is provided, the second high frequency power introducing device 701 is preferably placed at the center of the placing circumference for the cylindrical substrates. When a plurality of second high frequency power introducing devices 701 are provided, they are preferably placed at equal intervals on a concentric circle having the same center as the placing circumference for the cylindrical substrates.

As for the supply of the high frequency power to the high frequency power introducing devices 102 and to the second high frequency power introducing device 701, it is also possible to supply the power to the high frequency power introducing devices 102 and to the second high frequency power introducing device 701 by branching the power source line routed from the high frequency power source 103 through the matching box 104. From the aspect of controllability, however, the power is preferably controllable independently of each other by such means as use of two independent power supplies and matching boxes as illustrated in FIGS. 7A and 7B. In this case, it is further preferable that a common oscillation source be used to the high frequency power introduced from the high frequency power introducing devices provided outside the placing circumference for the cylindrical substrates and the high frequency power introduced from the second high frequency power introducing device, as stated previously.

The specific procedures for forming the deposited films in the apparatus as shown in FIGS. 7A and 7B are schematically similar to those with the apparatus shown in FIGS. 5A and 5B. The apparatus illustrated in FIGS. 7A and 7B requires the two independent high frequency power controls, but procedures of introducing high frequency powers may be such that the power introduced from the high frequency power introducing means 102 is set to a predetermined value and thereafter the power introduced from the second high frequency power introducing device 701 is set to a predetermined value. The procedures may be reversed. The power introduced from the high frequency power introducing means 102 and the power introduced from the second high frequency power introducing device 701 may also be set to the respective predetermined values on a concurrent and parallel basis.

Figure 8A:
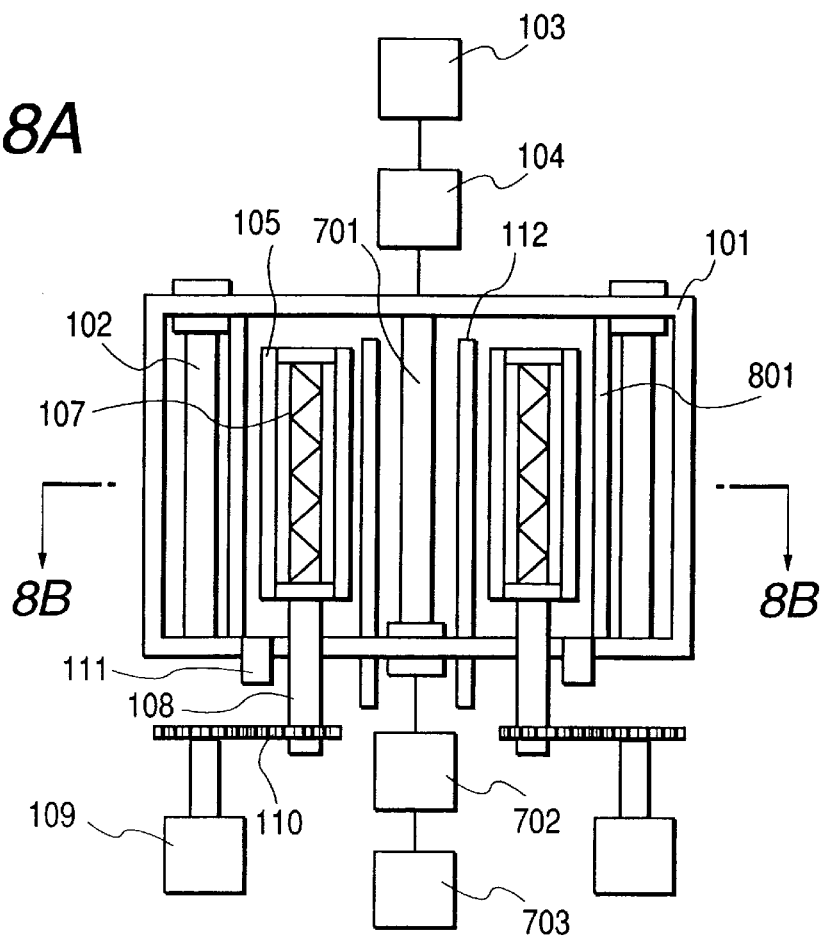
FIG. 8A is a schematic, longitudinal, sectional view for explaining another example of the deposited film forming apparatus.
Figure 8B:
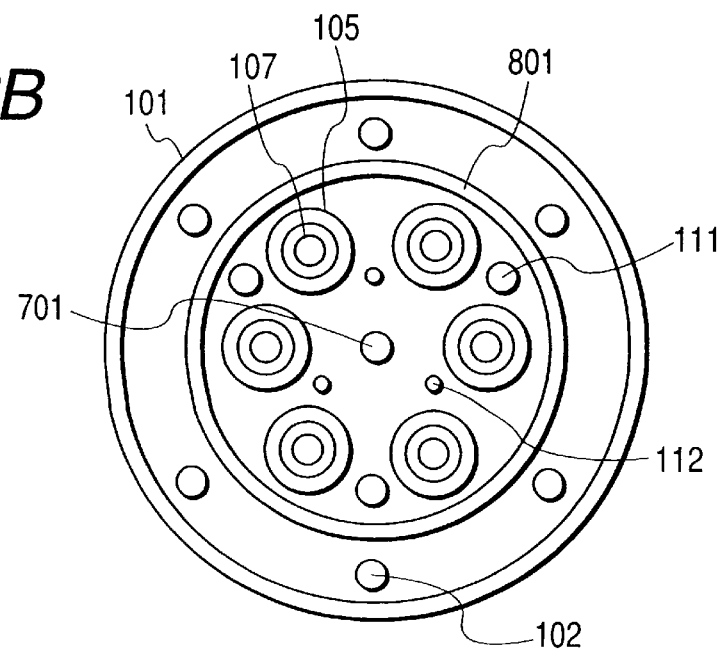
FIG. 8B is a transverse, sectional view taken along line 8B—8B of FIG. 8A for explaining the example of the deposited film forming apparatus.

In a further embodiment of the present invention, as illustrated in FIGS. 8A and 8B, the film forming space in which the source gas is decomposed is constructed so that the film forming space is limited to a columnar region by a cylindrical wall 801, at least a part of which is comprised of a non-conductive material, and that the center axis of the columnar film forming space passes the center of the placing circumference for the cylindrical substrates 105. The high frequency power introducing means 102 provided outside the placing circumference for the cylindrical substrates 105 are located outside the columnar wall 801, whereby the utilization efficiency of source gas is increased and whereby defects in the deposited films to be formed become controllable as well. In FIGS. 8A and 8B reference numeral 801 denotes the cylindrical wall, at least a part of which is comprised of the non-conductive material. Specific examples of the non-conductive material include alumina, titanium dioxide, aluminum nitride, boron nitride, zircon, cordierite, zircon-cordierite, silicon oxide, beryllium oxide, mica ceramics, and so on. Among these materials, alumina is particularly preferable in terms of less absorption of the high frequency power.

It is preferable for enhancing the uniformity of high frequency power supplied that a cylindrical, electroconductive shield maintained at a fixed potential with the center axis thereof passing the center of the placing circumference for the cylindrical substrates 105 be provided so as to surround the high frequency power introducing means 102 provided outside the cylindrical wall surface 801. The reaction vessel 101 may also serve as this cylindrical, conductive shield.

Specific procedures for forming the deposited film with the apparatus as illustrated in FIGS. 8A and 8B are also schematically similar to those with the apparatus illustrated in FIGS. 7A and 7B.

The present invention as described above can be applied to formation of light receiving members for electrophotography of the a-Si type, for example, as illustrated in FIGS. 9A to 9D.

Figure 9A:
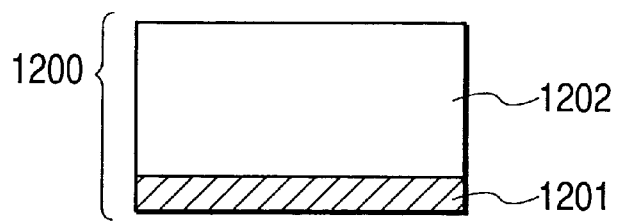
FIGS. 9A, 9B, 9C, and 9D are schematic, sectional views for explaining preferred examples of the light receiving members for electrophotography that can be formed by use of the plasma processing apparatus of the present invention.

The photosensitive member 1200 for electrophotography illustrated in FIG. 9A has a photoconductive layer 1202 with a photoconductive property comprising amorphous silicon containing components of hydrogen atoms or halogen atoms (hereinafter referred to as "a-Si:H, X"), provided on a support 1201.

Figure 9B:
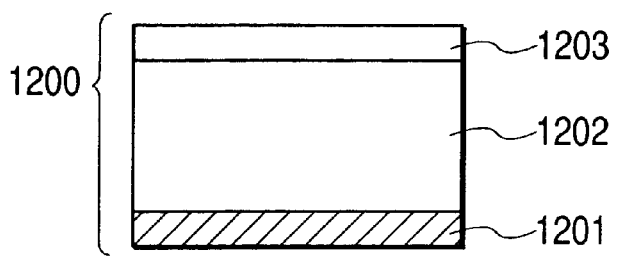

The photosensitive member 1200 for electrophotography illustrated in FIG. 9B is constructed of a photoconductive layer 1202 with the photoconductive property comprised of a-Si:H, X and a surface layer 1203 of the amorphous silicon type (or an amorphous carbon type), provided on the support 1201.

Figure 9C:
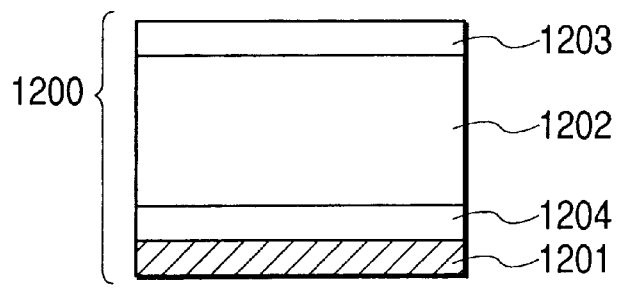

The photosensitive member 1200 for electrophotography illustrated in FIG. 9C is constructed of a charge injection inhibiting layer 1204 of the amorphous silicon type, a photoconductive layer 1202 with the photoconductive property comprised of a-Si:H, X, and a surface layer 1203 of the amorphous silicon type (or the amorphous carbon type), provided on the support 1201.

Figure 9D:
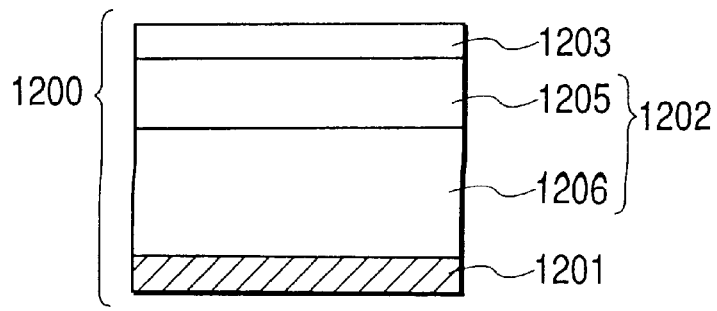

The photosensitive member 1200 for electrophotography illustrated in FIG. 9D has a photoconductive layer 1202 provided on the support 1201. This photoconductive layer 1202 is comprised of a charge generating layer 1205 and a charge transport layer 1206 comprised of a-Si:H, X, and the surface layer 1203 of the amorphous silicon type (or the amorphous carbon type) is provided thereon.

EXAMPLES

The present invention will be described in further detail with examples thereof, but it should be noted that the present invention is by no means intended to be limited to these.

Example 1

Using the deposited film forming apparatus shown in FIGS. 5A and 5B, a-Si deposited films were formed in the thickness of 1 μm on cylindrical aluminum cylinders 105 having the diameter of 80 mm and the length of 358 mm under the conditions shown in Table 1 with an oscillation frequency of the high frequency power source 103 at 50 MHz.

As a high frequency power introducing means 102 was used a cathode electrode of a cylindrical aluminum member having the diameter 500 mm, the height 470 mm, and the thickness 3 mm. The surface of the high frequency power introducing means 102 was subjected to blast processing so that the surface roughness Rz with the reference length of 2.5 mm became 50 μm. The supply of the high frequency power to the high frequency power introducing means 102 was conducted as follows. The high frequency power outputted from the high frequency power source 103 was arranged to be supplied through the matching box 104 to a coaxial supply line. After that, the high frequency power was supplied through the power source line branched into two lines in the same coaxial structure to two positions on the cylindrical high frequency power introducing means 102. The power supplying positions on the high frequency power introducing means 102 were two points shifted by 180° in the circumferential direction and at the center in the direction of the height (i.e., at the position of 235 mm from an edge of cylinder).

The source gas supply means 112 were alumina pipes having the inner diameter 10 mm and the outer diameter 13 mm, which were of the structure in which the end portions thereof were sealed and in which the source gas was able to be supplied through gas outlet pores of the diameter 1.2 mm provided on the pipes. The set positions of the source gas supplying means 112 were within the placing circumference for the cylindrical substrates and the three means 112 were arranged on a concentric circle. The surfaces of the source gas supplying means 112 were subjected to blast processing so that the surface roughness Rz with the reference length of 2.5 mm became 20 μm.

For evaluation of the film quality of deposited films, a glass substrate of Corning #7059 with an evaporated comb-shaped electrode of Cr having the gap of 250 μm was placed as an electrical characteristic evaluation substrate at the center position in the axial direction on the surface of one cylindrical substrate out of the six substrates.

The formation of deposited films using the apparatus described above was carried out schematically as follows.

First, the cylindrical substrates 105 held by the substrate holders 106 were set on the rotation shafts 108 in the reaction vessel 101. After that, the inside of the reaction vessel 101 was evacuated through the exhaust ports 111 by an unrepresented evacuation device. Subsequently, the cylindrical substrates 105 were rotated at the rate of 10 rpm through the rotation shafts 108 by the motors 109. Further, while Ar was supplied at 500 sccm through the source gas supplying means 112 into the reaction vessel 101, the cylindrical substrates 105 were heated to and controlled at 250° C. by the heat generators 107. That state was maintained for two hours.

Then the supply of Ar was stopped and the inside of the reaction vessel 101 and the film forming space was evacuated through the exhaust ports 111 by an unrepresented evacuation device. Thereafter, the source gas shown in Table 1 was introduced through the source gas supplying means 112. After having checked that the flow rate of the source gas reached the set flow rate and that the pressure inside the film forming space 114 became stable, the output value of the high frequency power source 103 was set to the power shown in Table 1 and the high frequency power was supplied through the matching box 104 to the cathode electrode 102. Exciting and dissociating the source gas by the high frequency power as supplied from the cathode electrode 102 into the film forming space results in formation of a-Si deposited film on the cylindrical substrates 105. After that, the supply of the high frequency power was stopped when the deposited films were obtained in the thickness of 1 μm. Then the supply of the source gas was also stopped, thus terminating the formation of deposited films.

TABLE 1

| Gas species and flow rate | $SiH_4$<br>500 sccm |
|---|---|
| Substrate temperature | 250° C. |
| Internal pressure | 1.3 Pa |
| Power | 800 W |
| Film thickness | 1 μm |

Comparative Example 1

Using the deposited film forming apparatus shown in FIGS. 2A and 2B, formation of a-Si deposited films was carried out under the conditions of Table 1 in the same manner as in Example 1. As the high frequency power introducing means 2302 was used a cathode electrode of a columnar member of SUS having the diameter 20 mm and the length 470 mm. The surface of the high frequency power introducing device 2302 was subjected to blast processing so that the surface roughness Rz with the reference length of 2.5 mm became 50 μm. The source gas supplying means 2312 were the same as in Example 1 and the set positions thereof were also the same as in Example 1.

Evaluation 1

In Example 1 and Comparative Example 1, the a-Si deposited films were formed thirty times by the procedure as described above and were compared and evaluated in the following manner.

Time for formation of deposited films: The time necessary for obtaining the deposited films in the thickness of 1 μm was measured for each time.

Characteristics of deposited films: The characteristic evaluation was conducted as to the following two items.

Photosensitivity: The photosensitivity was evaluated by measuring ((photoconductivity σp)/(dark conductivity σd)) of the deposited film obtained on the electrical characteristic evaluation substrate. The photoconductivity σp was defined as a conductivity when irradiated with a He—Ne laser (the wavelength 632.8 nm) of the intensity 1 mW/cm². Accordingly, a larger value of the photosensitivity indicates better characteristics of the deposited films.

Defect density: The defect density was measured in the region from the edge of the valence band to 0.8 eV above the valence band edge (on the conduction band side) by the CPM (Constant Photocurrent Method). Accordingly, a smaller value of the defect density indicates better characteristics of the deposited film.

Figure 10A:
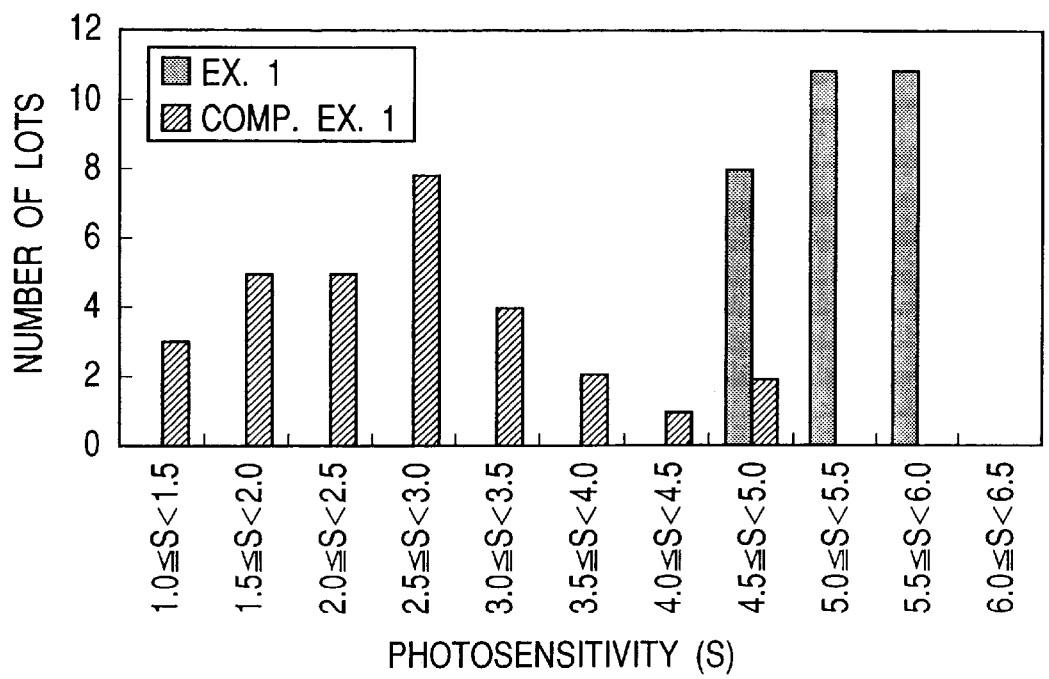
FIGS. 10A and 10B are graphs for explaining an example of characteristic evaluation results of deposited films.
Figure 10B:
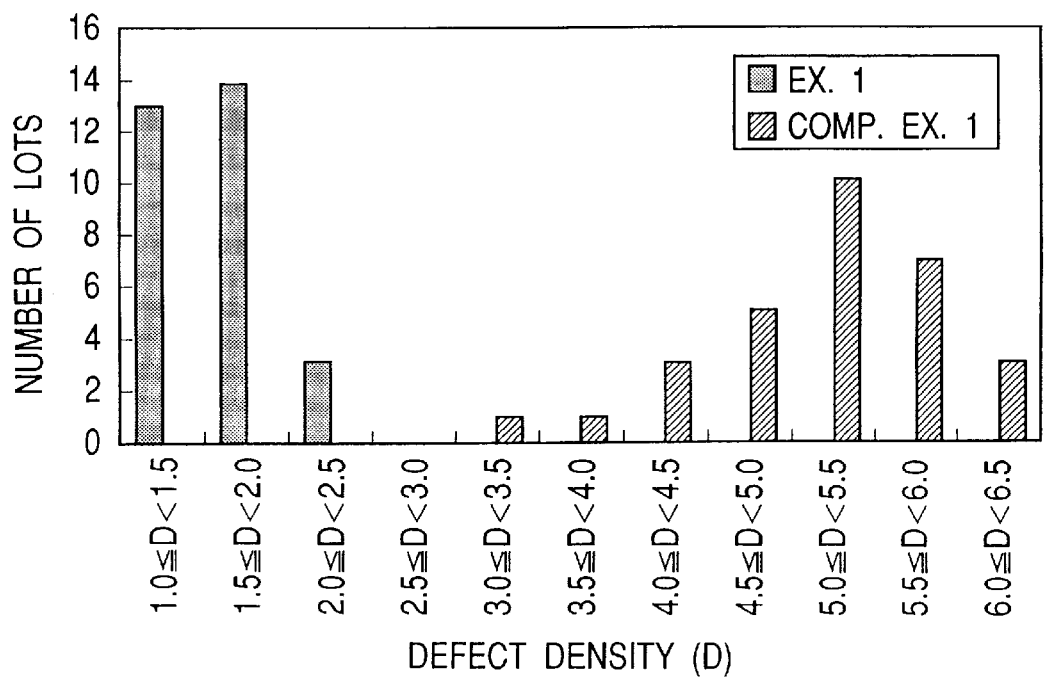

As a result of the above comparison and evaluation, the necessary deposited film forming time in Comparative Example 1 was 1.8 times that in Example 1. The evaluation results about the deposited film characteristics are shown in FIGS. 10A and 10B. In FIGS. 10A and 10B, both the photosensitivity and the defect density are indicated by relative values with each of the minimum values obtained for the two items throughout Example 1 and Comparative Example 1 being defined as 1.

Concerning the photosensitivity, the average of Example 1 was 2.0 times that of Comparative Example 1, and it was thus confirmed that deposited films with good photosensitivity were formed by application of the present invention. As for the defect density, the average of Example 1 was 0.31 times that of Comparative Example 1 and it was thus confirmed that good deposited films with a suppressed defect density were formed by application of the present invention. Further, the variation among lots as to each of the photosensitivity and the defect density was smaller in Example 1 than in Comparative Example 1, as shown in FIGS. 10A and 10B, and it was thus confirmed that the present invention permitted deposited film formation with less variation in the characteristics of deposited films among lots.

As apparent from the above, it was confirmed that the present invention permitted formation of deposited films having good characteristics with a high reproducibility and in a short deposited film forming time.

Example 2

Using the deposited film forming apparatus illustrated in FIGS. 6A and 6B, ten lots of photosensitive members, sixty photosensitive members in total, composed of the charge injection inhibiting layer, the photoconductive layer, and the surface layer, were made on cylindrical aluminum cylinders 105 having the diameter 80 mm and the length 358 mm under the conditions shown in Table 2 with the oscillation frequency of the high frequency power source 103 set at 100 MHz.

The film forming space in which the source gas was decomposed was limited to the columnar region having the diameter 400 mm and the height 500 mm by the cylindrical wall surface 601.

The high frequency power introducing means 102 were circular columns of SUS in the diameter of 20 mm the outside which was covered by alumina pipes having the inner diameter 21 mm and the outer diameter 24 mm. The alumina pipes were subjected to blast processing so that the surface roughness Rz with the reference length of 2.5 mm was 20 $\mu$m. The high frequency power introducing means 102 were set outside the placing circumference for the cylindrical substrates and placed at equal intervals on the same circumference having the same center as the placing circumference for the cylindrical substrates 105.

The source gas supplying means 112 were alumina pipes having the inner diameter 10 mm and the outer diameter 13 mm and were constructed in such a structure that their end portions were sealed and that the source gas was able to be supplied through gas outlet ports of the diameter 1.2 mm provided on the pipes. The source gas supplying means 112 were set outside the placing circumference for the cylindrical substrates such that the six means 112 were placed at equal intervals on the same circumference having the same center as the placing circumference for the cylindrical substrates 105. The surfaces of the source gas supplying means 112 were subjected to blast processing so that the surface roughness Rz with the reference length of 2.5 mm became 20 $\mu$m.

The procedures for producing the photosensitive members were schematically as follows.

First, the cylindrical substrates 105 held by the substrate holders 106 were set on the rotation shafts 108 inside the reaction vessel 101. After that, the inside of the reaction vessel 101 was evacuated through the exhaust ports 111 by an unrepresented evacuation device. Subsequently, the cylindrical substrates 105 were rotated at the rate of 10 rpm through the rotation shafts 108 by the motors 109. Further, while Ar was supplied at 500 sccm through the source gas supplying means 112 into the reaction vessel 101, the cylindrical substrates 105 were heated to and controlled at 250° C. by the heat generators 107. That state was maintained for two hours.

Then the supply of Ar was stopped and the reaction vessel 101 was evacuated through the exhaust ports 111 by an unrepresented evacuation device. Thereafter, the source gas for formation of the charge injection inhibiting layers shown in Table 2 was introduced through the source gas supplying means 112. After having checked that the flow rate of the source gas reached the set flow rate and that the pressure inside the reaction vessel 101 became stable, the output value of the high frequency power source 103 was set to the power indicated in Table 2 and the high frequency power was supplied through the matching box 104 to the high frequency power introducing means 102. The high frequency power, supplied from the high frequency power introducing means 102 into the reaction vessel 101, excited and dissociated the source gas, whereby the charge injection inhibiting layers were formed on the cylindrical substrates 105. After the layers were formed in a desired thickness, the supply of the high frequency power was stopped and then the supply of the source gas was also stopped, thus terminating the formation of the charge injection inhibiting layers. Then the photoconductive layers and surface layers were successively formed by successively carrying out the operations for layer formation a plurality of times under the conditions indicated in Table 2.

TABLE 2

|  | Charge injection inhibiting layer | Photoconductive layer | Surface layer |
|---|---|---|---|
| Gas species and flow rates |  |  |  |
| SiH$_4$ (sccm) | 200 | 300 | 20 |
| H$_2$ (sccm) | 200 | 1000 |  |
| B$_2$H$_6$ (ppm) relative to SiH$_4$ | 1000 | 1.2 |  |
| CH$_4$ (sccm) |  |  | 500 |
| NO (sccm) | 10 |  |  |
| Substrate temperature (° C.) | 250 | 250 | 250 |
| Internal pressure (Pa) | 1.3 | 1.3 | 1.5 |
| Power (W) | 900 | 2250 | 750 |
| Film thickness ($\mu$m) | 3 | 30 | 0.5 |

Comparative Example 2

Figure 3A:
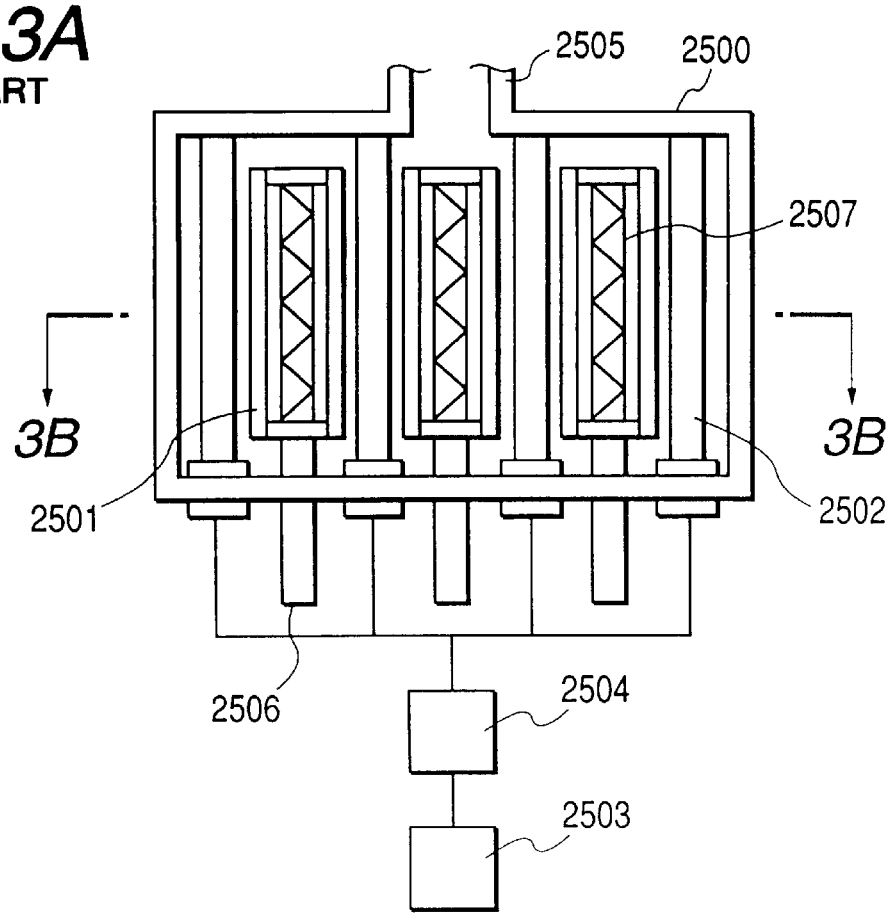
FIG. 3A is a schematic, longitudinal, sectional view for explaining another example of the deposited film forming apparatus.
Figure 3B:
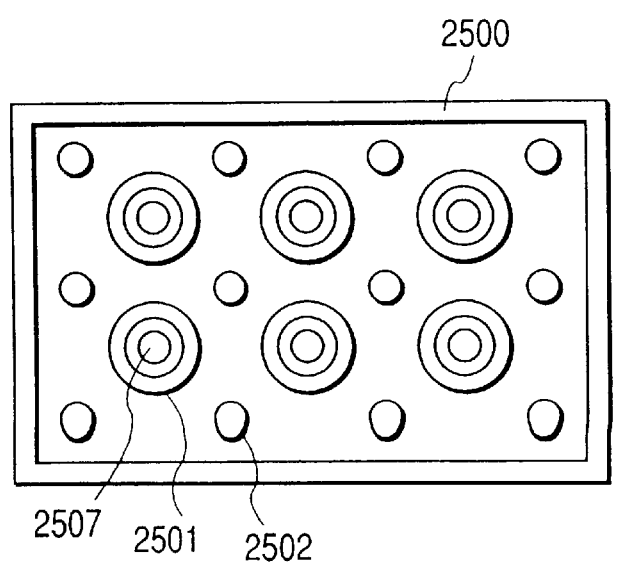
FIG. 3B is a transverse, sectional view taken along line 3B—3B of FIG. 3A for explaining the example of the deposited film forming apparatus.

Using the deposited film forming apparatus shown in FIGS. 3A and 3B, ten lots of photosensitive members, sixty photosensitive members in total, composed of the charge injection inhibiting layer, the photoconductive layer, and the surface layer, were produced under the conditions indicated in Table 2 in the same manner as in Example 2.

In FIGS. 3A and 3B the high frequency power introducing means 2502 were circular columns of SUS having the diameter 20 mm and were constructed such that the outside thereof was covered by an alumina pipe having the inner diameter 21 mm and the outer diameter 24 mm, as in Example 2. The alumina pipes were subjected to blast processing so that the surface roughness Rz with the reference length of 2.5 mm became 20 μm. Twelve such high frequency power introducing means 2502 were arranged in the reaction vessel 2500 as illustrated in FIGS. 3A and 3B. They were arranged such that the distances between each high frequency power introducing device 2502 and adjacent cylindrical substrates all become equal.

The source gas supplying means (not illustrated) were also alumina pipes having the inner diameter 10 mm and the outer diameter 13 mm such that the end portions thereof were sealed and that the source gas was able to be supplied through gas outlet ports of the diameter 1.2 mm provided on the pipes. The source gas supplying means were set at center positions between electrodes. The surfaces of the source gas supplying means were subjected to blast processing so that the surface roughness Rz with the reference length of 2.5 mm became 20 μm.

Evaluation 2

Each of the a-Si photosensitive members fabricated in Example 2 and Comparative Example 2 as described above was set in a copying machine NP-6750 manufactured by CANON Inc. and further modified for the present tests, and characteristic evaluation of the photosensitive members was carried out. Evaluation items were two items of "unevenness of image density" and "variation in characteristics" and evaluation of each item was conducted according to the specific evaluation methods described below.

Unevenness of image density: First, after the current of the primary charger was adjusted such that the dark potential at the position of the developing unit became a constant value, the light quantity of image exposure was adjusted using predetermined white paper having the reflection density of 0.01 or less as an original so that the potential under light irradiation (hereinafter referred to as light potential) at the position of the developing unit became a predetermined value. Then a halftone chart (part number: FY9-9042) manufactured by CANON Inc. was placed on an original table and copied. Each copy was evaluated by the difference between the maximum and the minimum of reflection densities in the entire area on the copy image obtained. The result of evaluation was given by an average of all the photosensitive members. Accordingly, a smaller value indicates a better result.

Characteristic variation: As to all four items including the above "unevenness of image density" and the following three items, the maximum and the minimum values were obtained for all the photosensitive members in each evaluation and then a value of (the maximum value)/(the minimum value) was calculated for each evaluation. The maximum of the calculated values for the four items was defined as the value of the characteristic variation. Accordingly, a smaller value indicates a better result.

Chargeability: The dark potential was measured at the position of the developing unit when a fixed current was allowed to flow to the primary charger of the copying machine. Accordingly, a larger dark potential indicates better chargeability. The measurement of chargeability was carried out over the entire region in the direction of the generating line of the photosensitive members and evaluation was made by the lowest dark potential thereof. Further, the evaluation result of chargeability was given by an average for all the photosensitive members. Accordingly, a larger value indicates a better result.

Sensitivity: After the current of the primary charger was adjusted so that the dark potential at the position of the developing unit became a constant value, a predetermined white paper having the reflection density of 0.01 or less as an original and the light quantity of image exposure was adjusted so that the light potential at the position of the developing unit became a predetermined value. The sensitivity was evaluated by the light quantity of image exposure at that time. Accordingly, a smaller quantity of image exposure indicates better sensitivity. The measurement of sensitivity was conducted over the entire region in the direction of the generating line of the photosensitive members and evaluation was made by the maximum light quantity of image exposure thereof. Further, the evaluation result of sensitivity was given by an average for all the photosensitive members. Accordingly, a smaller value indicates a better result.

Optical memory: After the current of the primary charger was adjusted so that the dark potential at the position of the developing unit became a constant value, the light quantity of image exposure was adjusted so that the light potential became a predetermined value where predetermined white paper was used as an original. In this state a ghost test chart (part number: FY9-9040) manufactured by CANON Inc. to which a black dot having the reflection density 1.1 and the diameter 5 mm were stuck, was placed on the original table, a halftone chart manufactured by CANON K.K. was overlaid thereon, and a copy image was taken. In the copy image thus obtained, the difference was measured between the reflection density of the halftone part and the reflection density of the black dot part of the diameter 5 mm in the ghost chart recognized on the halftone copy, thereby measuring the optical memory. The measurement of optical memory was conducted throughout the entire region in the direction of the generating line of the photosensitive members and the evaluation was made by the maximum reflection density difference thereof. Further, the evaluation result of optical memory was given by an average for all the photosensitive members. Accordingly, a smaller value indicates a better result.

The evaluation results were given by using the results of Comparative Example 2 as a basis, wherein an improvement of not less than 40% was given an evaluation result of ⊚, an improvement not less than 30% and less than 40% an evaluation result of ⊚–○, an improvement not less than 20% and less than 30% an evaluation result of 0, an improvement not less than 10% and less than 20% an evaluation result of ○–Δ, an improvement of less than 10% an evaluation result of Δ, and deterioration an evaluation result of x.

The evaluation results were such that the "unevenness of image density" was ○–Δ and the "characteristic variation" was ○. There was a distinct difference recognized between Example 2 and Comparative Example 2 as to the both items of the "unevenness of image density" and "characteristic variation" and, particularly, a clear difference was recognized in the "characteristic variation." This verified the improving effect in the "unevenness of image density" and "characteristic variation" by the present invention and, particularly, verified the outstanding effect in the characteristic variation.

In addition, the electrophotographic images obtained by use of the electrophotographic photosensitive members made in Example 2 were extremely excellent images free from image smearing or the like.

Example 3

Using the deposited film forming apparatus illustrated in FIGS. 7A and 7B, ten lots of photosensitive members, totaling sixty photosensitive members, composed of the charge injection inhibiting layer, the photoconductive layer, and the surface layer, were formed on cylindrical aluminum cylinders 105 having the diameter 80 mm and the length 358 mm under the conditions shown in Table 3 with the oscillation frequency of the high frequency power source set at 100 MHz.

The film forming space in which the source gas was decomposed was limited to the columnar region having the diameter 400 mm and the height 500 mm by the inner surface of the reaction vessel 101.

The structure of the high frequency power introducing means 102 and the second high frequency power introducing means 701 was the same as that of the high frequency power introducing means in Example 2. As for their set positions, the high frequency power introducing means 102 were set at the same positions as in Example 2 and the second high frequency power introducing means 701 was set at the center of the placing circumference for the cylindrical substrates 105. The structure and set positions of the source gas supplying means 112 were the same as in Example 2.

The procedures for fabricating the photosensitive members were substantially the same as in Example 2. Introduction of the high frequency power was conducted on the concurrent and parallel basis to the high frequency power introducing means 102 and to the second high frequency power introducing means 701.

TABLE 3

| | Charge injection inhibiting layer | Photo-conductive layer | Surface layer |
| --- | --- | --- | --- |
| Gas species and flow rates | | | |
| SiH$_4$ (sccm) | 200 | 300 | 20 |
| H$_2$ (sccm) | 200 | 1000 | |
| B$_2$H$_6$ (ppm) relative to SiH$_4$ | 1000 | 1.2 | |
| CH$_4$ (sccm) | | | 500 |
| NO (sccm) | 10 | | |
| Substrate temperature (° C.) | 250 | 250 | 250 |
| Internal pressure (Pa) | 1.3 | 1.3 | 1.5 |
| Power (W) | | | |
| electrodes outside cylinder placing circumference | 720 (120 per electrode) | 1800 (300 per electrode) | 600 (100 per electrode) |
| electrode inside cylinder placing circumference (second high frequency power introducing means) | 180 | 450 | 150 |
| Film thickness (μm) | 3 | 30 | 0.5 |

Evaluation 3

Each of the a-Si photosensitive members thus fabricated was set in a copying machine NP-6750 manufactured by CANON Inc. and further modified for the present tests, and characteristic evaluation of the photosensitive members was carried out. Evaluation items were two items of the "unevenness of image density" and "variation in characteristics" and evaluation of each item was conducted according to the specific evaluation methods similar to those in Example 2.

The evaluation results were given by using the results of Example 2 as a basis, wherein an improvement of not less than 40% was given an evaluation result of ⊚, an improvement not less than 30% and less than 40% an evaluation result of ⊚–○, an improvement not less than 20% and less than 30% an evaluation result of ○, an improvement not less than 10% and less than 20% an evaluation result of ○–Δ, an improvement of less than 10% an evaluation result of Δ, and deterioration an evaluation result of x.

The evaluation results showed that the "unevenness of image density" was ○–Δ and the "characteristic variation" was ○–Δ. Better results than in Example 2 were achieved as to the both items of "unevenness of image density" and "characteristic variation," and the outstanding effect was thus recognized. This verified that the effects of the present invention became more prominent by the configuration illustrated in FIGS. 7A and 7B wherein the second high frequency power introducing means was set inside the placing circumference for the cylindrical substrates. The electrophotographic images formed by use of the electrophotographic photosensitive members fabricated in Example 3 were very excellent images free from image smearing or the like.

Example 4

Using the deposited film forming apparatus illustrated in FIGS. 8A and 8B, ten lots of photosensitive members, totaling sixty photosensitive members, composed of the charge injection inhibiting layer, the photoconductive layer, and the surface layer, were formed on cylindrical aluminum cylinders 105 having the diameter 80 mm and the length 358 mm under the conditions shown in Table 3. The frequency of the high frequency power was 100 MHz.

In FIGS. 8A and 8B, the film forming space in which the source gas was decomposed was limited to the columnar region involving the cylindrical substrates 105, by the cylindrical wall 801. The center axis of the columnar region was arranged to pass the center of the placing circumference for the cylindrical substrates. The cylindrical wall 801 was comprised of a cylinder of alumina having the inner diameter 400 mm, the thickness 20 mm, and the height 500 mm. The inner surface of the cylindrical wall 801 was subjected to blast processing so that the surface roughness Rz with the reference length of 2.5 mm became 20 μm.

The high frequency power introducing means 102 were circular columns of SUS having the diameter 20 mm and the length 470 mm and were set outside the cylindrical wall 801. The six means 102 were set at equal intervals on a concentric circle and with a clearance of 30 mm from the outer surface of the cylindrical wall 801. The second high frequency power introducing means 701 was of such structure that an alumina pipe having the inner diameter 21 mm and the outer diameter 24 mm covered the outside of a circular column of SUS having the diameter 20 mm and the length 470 mm and that it was set at the center of a circle in the placing circumference for the cylindrical substrates 105. The alumina pipe was subjected to blast processing so that the surface roughness Rz with the reference length of 2.5 mm became 20 μm.

The reaction vessel 101 was a cylindrical vessel of aluminum and also served as a shield for the high frequency power introducing means 102 set outside the cylindrical wall 801.

The source gas supplying means 112 were alumina pipes having the inner diameter 10 mm and the outer diameter 13 mm and having such structure that their end portions were sealed and that the source gas was able to be supplied through gas outlet ports of the diameter 1.2 mm provided on the pipes. The source gas supplying means 112 were set at positions inside the placing circumference for the cylindrical substrates and there were the three means 112 placed at equal intervals on the same circumference having the same center as the placing circumference for the cylindrical substrates 105. The surfaces of the source gas supplying means 112 were subjected to blast processing so that the surface roughness Rz with the reference length of 2.5 mm became 20 μm.

The procedures for producing the photosensitive members were substantially the same as in Example 3.

Evaluation 4

Each of the a-Si photosensitive members thus fabricated was set in a copying machine NP-6750 manufactured by CANON Inc. and further modified for the present tests, and characteristic evaluation of the photosensitive members was carried out. Evaluation items were three items of "image defects," "unevenness of image density," and "variation in characteristics" and evaluation of each item was conducted according to the following evaluation method and the specific evaluation methods similar to those in Example 2.

Evaluation method for image defect: A halftone chart (part number: FY 9-9042) manufactured by CANON Inc. was placed on an original table and copied. The number of white dots with a diameter of 0.1 mm or more found inside the same area of the thus obtained copy image was counted, and the evaluation was carried out in terms of that number. Accordingly, a smaller number indicates a better result.

The evaluation results were given by using the results of Example 3 as a basis, wherein an improvement of not less than 40% was given an evaluation result of ⊙, an improvement not less than 30% and less than 40% an evaluation result of ⊙–○, an improvement not less than 20% and less than 30% an evaluation result of ○, an improvement not less than 10% and less than 20% an evaluation result of ○–Δ, an improvement of less than 10% an evaluation result of Δ, and deterioration an evaluation result of x.

The evaluation results showed that the "image defects" were ○, the "unevenness of image density" Δ, and the "characteristic variation" Δ. Better results than in Example 3 were achieved as to the "image defects," and good results equivalent to those in Example 3 were also achieved as to the "unevenness of image density" and "characteristic variation." This verified that an outstanding effect to suppress the image defects was brought about by the configuration wherein the film forming space was limited to the columnar region by the wall for the film forming space and wherein the high frequency power introducing means were set outside the wall for the film forming space. Further, when the present example was compared with Example 3 as to the amount of the source gas necessary per photosensitive member, the amount of the source gas in Example 4 was about 10% less than in Example 3. Therefore, it was confirmed that the utilization efficiency of source gas was increased by the configuration wherein the film forming space was limited to the columnar region by the wall for the film forming space and wherein the high frequency power introducing means were set outside the wall for the film forming space.

The electrophotographic images formed by use of the electrophotographic photosensitive members fabricated in Example 4 were extremely excellent images free from image smearing the like.

Example 5

Using the deposited film forming apparatus illustrated in FIGS. 7A and 7B wherein the six cylindrical aluminum cylinders 105 having the diameter 108 mm and the length 358 mm were able to be set on the same circumference, ten lots of photosensitive members, totaling sixty photosensitive members, comprised of the charge injection inhibiting layer, the photoconductive layer, and the surface layer, were formed on the cylindrical aluminum cylinders 105 under the conditions shown in Table 4.

The film forming space in which the source gas was decomposed was limited to the columnar region having the diameter 500 mm and the height 500 mm by the internal surface of the reaction vessel 101.

The structure of the high frequency power introducing means 102 and the second high frequency power introducing means 701 was the same as that of the high frequency power introducing means in Example 2. As for their set positions, the high frequency power introducing means 102 were set outside the placing circumference for the cylindrical substrates and the six means 102 were arranged at equal intervals on the same circumference having the same center as the placing circumference for the cylindrical substrates 105. The second high frequency power introducing means 701 was set at the center of the placing circumference for the cylindrical substrates 105.

The source gas supplying means 112 were those of the same structure as in Example 2. The set positions of the source gas supplying means 112 were outside the placing circumference for the cylindrical substrates and the six means 112 were set at equal intervals on the same circumference having the same center as the placing circumference for the cylindrical substrates 105.

The oscillation frequencies of the high frequency power sources were seven conditions of 13.56, 30, 50, 100, 300, 450, and 600 MHz. However, 13.56 MHz and 30 MHz were unable to maintain the discharge under the pressure shown in Table 4, and thus the pressure at the two frequencies was increased to 20 times and 5 times, respectively, the pressure in Table 4 in order to maintain stable discharge.

The procedures for producing the photosensitive members were substantially the same as in Example 2. Introduction of the high frequency power was conducted on a concurrent and parallel basis to the high frequency power introducing means 102 and to the second high frequency power introducing means 701. Without discontinuing discharge between the layers, the source gas flow rate and the high frequency power were switched to the conditions of the subsequent layer within 120 seconds, and thus the formation of deposited films was carried out continuously.

TABLE 4

|  | Charge injection inhibiting layer | Photo-conductive layer | Surface layer |
|---|---|---|---|
| Gas species and flow rates | | | |
| $SiH_4$ (sccm) | 200 | 200 | 20 |
| $H_2$ (sccm) | 1000 | 1000 | |
| $B_2H_6$ (ppm) relative to $SiH_4$ | 1000 | 1.2 | |
| $CH_4$ (sccm) | 200 | | 500 |
| Substrate temperature (° C.) | 250 | 250 | 250 |
| Internal pressure (Pa) | 1.0 | 1.0 | 1.0 |
| Power (W) | | | |
| electrodes outside cylinder placing circumference | 600 (100 per electrode) | 1800 (300 per electrode) | 480 (80 per electrode) |
| electrode inside cylinder placing circumference | 150 | 450 | 120 |

TABLE 4-continued

|  | Charge injection inhibiting layer | Photo- conductive layer | Surface layer |
|---|---|---|---|
| (second high frequency power introducing means) Film thickness (μm) | 3 | 30 | 0.5 |

Evaluation 5

Each of the a-Si photosensitive members thus fabricated was set in a copying machine NP-6062 manufactured by CANON Inc., which was further modified for the present tests, and characteristic evaluation of the photosensitive members was conducted. The evaluation items were four items of "chargeability," "sensitivity," "optical memory," and "characteristic variation" and evaluation of each item was made according to the specific evaluation methods similar to those in Example 2.

The evaluation results are shown in Table 5. In Table 5, the evaluation results are given by using the results at 13.56 MHz as a basis, wherein an improvement of not less than 40% is given an evaluation result of ⊙, an improvement not less than 30% and less than 40% an evaluation result of ⊙–○, an improvement not less than 20% and less than 30% an evaluation result of ○, an improvement not less than 10% and less than 20% an evaluation result of ○–Δ, an improvement of less than 10% an evaluation result of Δ, and deterioration an evaluation result of x.

It was confirmed that in the range of 50 to 450 MHz particularly good results were achieved as to either item of "chargeability," "sensitivity," "optical memory," and "characteristic variation."

All electrophotographic images formed by use of the electrophotographic photosensitive members fabricated in Example 5 were good images free from image smearing or the like, and particularly, the electrophotographic images formed by use of the electrophotographic photosensitive members fabricated in the range of 50 to 450 MHz were extremely excellent.

TABLE 5

| Freq. (MHz) | Charge- ability | Sensitivity | Optical memory | Variation in character- istics |
|---|---|---|---|---|
| 13.56 | — | — | — | — |
| 30 | Δ | Δ | Δ | Δ |
| 50 | ○–Δ | ○–Δ | ○–Δ | ○–Δ |
| 100 | ○ | ○ | ○ | ○ |
| 300 | ○ | ○ | ○ | ○ |
| 450 | ○–Δ | ○–Δ | ○–Δ | ○–Δ |
| 600 | ○–Δ | ○–Δ | ○–Δ | X |

Example 6

Figure 11A:
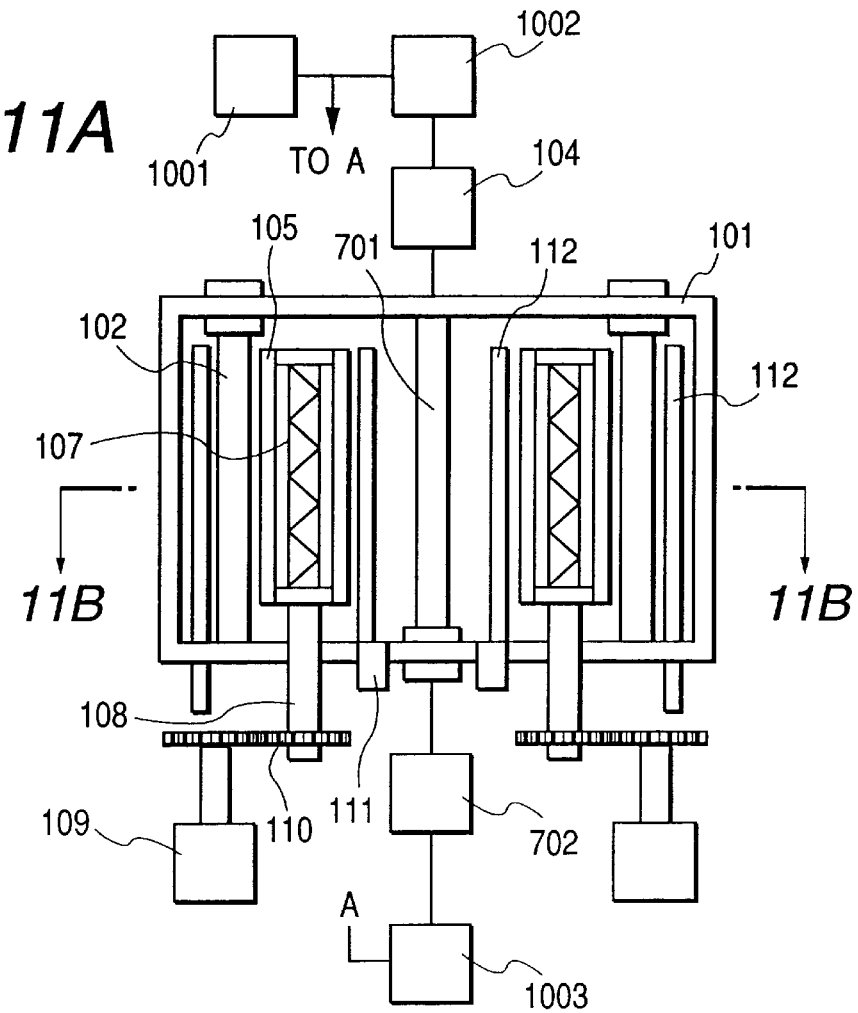
FIG. 11A is a schematic, longitudinal, sectional view for explaining another example of the deposited film forming apparatus.
Figure 11B:
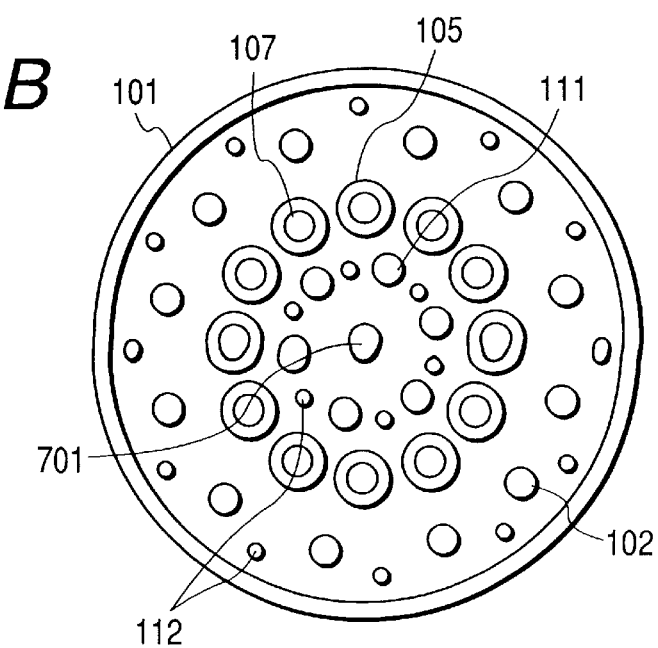
FIG. 11B is a transverse, sectional view taken along line 11B—11B of FIG. 11A for explaining the example of the deposited film forming apparatus.

The deposited film forming apparatus (FIGS. 7A and 7B) used in Example 3 was modified so that the cylindrical substrates 105, the high frequency power introducing means 102, the second high frequency power introducing means 701, the source gas supplying means 112, and the exhaust ports 111 were arranged as illustrated in FIGS. 11A and 11B. Using the deposited film forming apparatus thus modified, ten lots of photosensitive members, totaling 120 photosensitive members, comprised of the charge transport layer, the charge generating layer, and the surface layer, were formed on cylindrical aluminum cylinders (cylindrical substrates) having the diameter 30 mm and the length 358 mm under the conditions shown in Table 6.

In FIGS. 11A and 11B, the source gas supplying means 112 were set inside and outside the placing circumference for the cylindrical substrates. The specific structure of each of the high frequency power introducing means 102, the second high frequency power introducing means 701, and the source gas supplying means 112 was the same as in Example 3. The procedures for fabricating the photosensitive members were also the same as in Example 3.

The high frequency power was supplied in such a way that a signal outputted from a high frequency oscillator 1001 was split into two, the signals were amplified by respective amplifiers 1002, 1003, and thereafter the amplified signals were supplied to respective matching boxes 104, 702. The frequency of the high frequency oscillator 1001 was 100 MHz.

TABLE 6

|  | Charge transport layer | Charge generating layer | Surface layer |
|---|---|---|---|
| Gas species and flow rates |  |  |  |
| SiH$_4$ (sccm) | 400 | 400 | 20 |
| H$_2$ (sccm) | 1000 | 1000 |  |
| B$_2$H$_6$ (ppm) relative to SiH$_4$ | 10→1.5 | 1.5 |  |
| CH$_4$ (sccm) | 600→0 |  | 1000 |
| Substrate temperature (° C.) | 250 | 250 | 250 |
| Internal pressure (Pa) | 2.1→1.3 | 1.3 | 2.0 |
| Power (W) |  |  |  |
| electrodes outside cylinder placing circumference | 2100 (175 per electrode) | 1800 (150 per electrode) | 600 (50 per electrode) |
| electrode inside cylinder placing circumference (second high frequency power introducing means) | 600 | 500 | 200 |
| Film thickness (μm) | 27 | 3 | 0.5 |

Comparative Example 3

Figure 12:
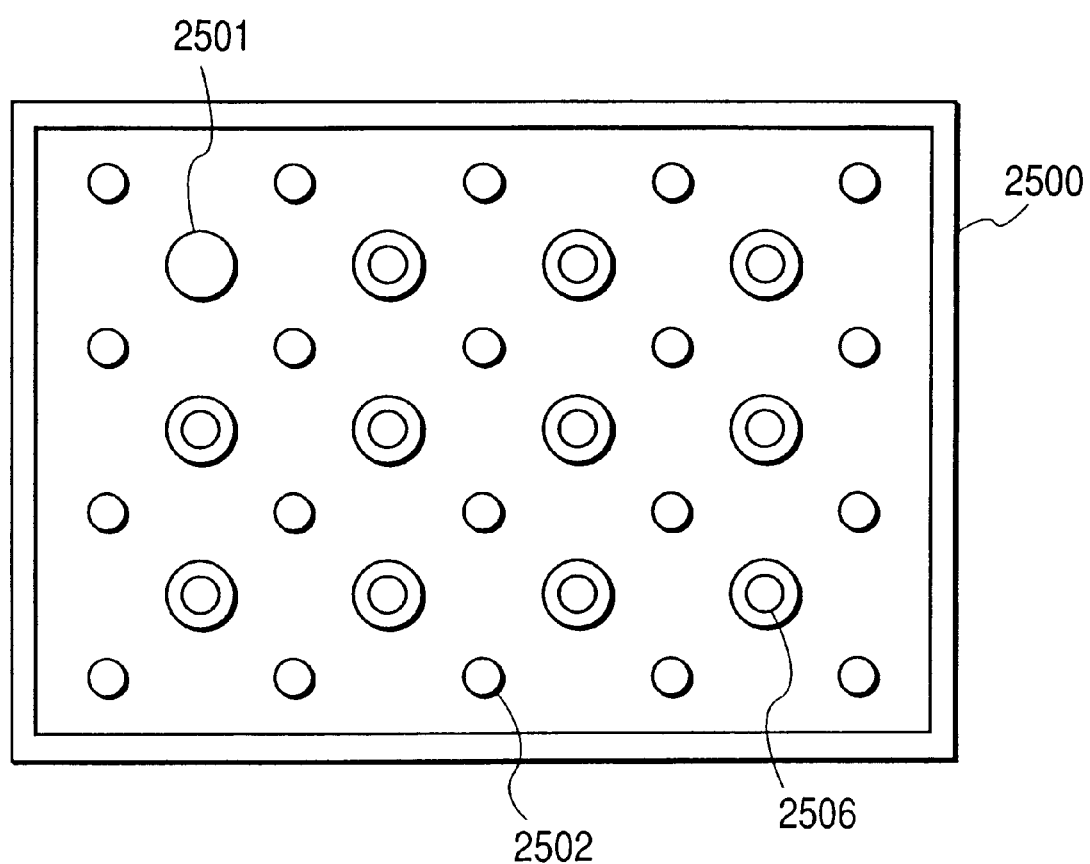
FIG. 12 is a transverse, sectional view for explaining another example of the deposited film forming apparatus.

The deposited film forming apparatus (FIGS. 3A and 3B) used in Comparative Example 2 was modified so that the cylindrical substrates 2501 and the high frequency power introducing means 2502 were arranged as illustrated in FIG. 12. In FIG. 12 numeral 2500 denotes the reaction vessel and 2506 are rotation shafts. Using the deposited film forming apparatus thus modified, ten lots of photosensitive members, totaling 120 photosensitive members, comprised of the charge transport layer, the charge generating layer, and the surface layer, were formed on cylindrical aluminum cylinders (cylindrical substrates) having the diameter 30 mm and the length 358 mm under the conditions shown in Table 6 with the frequency of the high frequency power source 2503 set at 100 MHz. The high frequency power, however, was adjusted so that the total power supplied from all the electrodes became the same as in Example 6.

In FIG. 12 the source gas supplying means (not illustrated) were set at center positions between the electrodes.

Evaluation 6

Each of the a-Si photosensitive members thus fabricated was set in a copying machine NP-6030 manufactured by CANON Inc. and further modified for the present tests, and characteristic evaluation of the photosensitive members was carried out. Evaluation items were two items of "unevenness of image density" and "variation in characteristics" and evaluation of each item was conducted according to the specific evaluation methods similar to those in Example 2.

The evaluation results were given by using the results of Comparative Example 3 as a basis, wherein an improvement of not less than 40% was given an evaluation result of ⊚, an improvement not less than 30% and less than 40% an evaluation result of ⊚ to ○, an improvement not less than 20% and less than 30% an evaluation result of ○, an improvement not less than 10% and less than 20% an evaluation result of ○ to Δ, an improvement of less than 10% an evaluation result of Δ, and deterioration an evaluation result of x.

The evaluation results were such that the "unevenness of image density" was ⊚ to ○ and the "characteristic variation" was ⊚. Therefore, the very good results were obtained as to the both items of "unevenness of image density" and "characteristic variation" and, particularly, the considerably outstanding effect was recognized as to the "characteristic variation."

As described above, according to the present invention, when forming deposited films by the high frequency-PCVD process, the characteristics of deposited films are improved and the characteristic variation among substrates or among lots is suppressed, thus permitting stable formation of deposited films with high uniformity and reproducibility. Further, the present invention decreases the deposited film forming time and increases the source gas utilization efficiency, thus reduce production cost.

As a result, the present invention permits the semiconductor devices, light receiving members for electrophotography, or the like with excellent characteristics to be produced on a stable basis at low cost.

What is claimed is:

1. A plasma processing apparatus comprising:
   a cylindrical vessel;
   a mount portion on which two or more substrates can be placed equidistant from each other on a first circle with a first diameter in the vessel;
   a source gas introducing means for introducing a source gas into a vessel; and
   two or more high frequency power supplying means for generating a plasma discharge space in the vessel,
   wherein the high frequency power supplying means are arranged in the plasma discharge space on a second circle concentric with the first circle with a second diameter larger than the first diameter, and wherein a number of the high frequency power supplying means is equal to or less than a number of substrates placed on the mount portion.

2. The plasma processing apparatus according to claim 1, wherein the number of high frequency power supplying means is the same as or one half of the number of substrates placed on the mount portion.

3. The plasma processing apparatus according to claim 1, wherein an additional high frequency power supplying means is provided inside a placing circumference for the cylindrical substrates.

4. The plasma processing apparatus according to claim 3, wherein the additional high frequency power supplying means is set at the center of the placing circumference for the cylindrical substrates.

5. The plasma processing apparatus according to claim 3, wherein the additional high frequency power supplying means is provided in plurality at equal intervals on a concentric circle having the same center as the placing circumference for the cylindrical substrates.

6. The plasma processing apparatus according to claim 3, wherein a high frequency power introduced from the high frequency power supplying means provided outside the placing circumference for the cylindrical substrates and a high frequency power introduced from the additional high frequency power supplying means are independently controllable.

7. The plasma processing apparatus according to claim 6, wherein the high frequency power introduced from the two or more high frequency power supplying means and the high frequency power introduced from the additional high frequency power supplying means are supplied from a common oscillation source.

8. The plasma processing apparatus according to claim 1, wherein a cylindrical wall is provided so as to surround the plurality of cylindrical substrates and the center axis of the cylindrical wall passes the center of the placing circumference for the cylindrical substrates.

9. The plasma processing apparatus according to claim 8, wherein at least a part of the cylindrical wall is comprised of a non-conductive material.

10. The plasma processing apparatus according to claim 8, wherein the two or more high frequency power supplying means provided outside the placing circumference for the cylindrical substrates are provided inside the cylindrical wall.

11. The plasma processing apparatus according to claim 1, wherein the source gas supplying means for supplying the source gas is provided inside and outside the placing circumference for the cylindrical substrates.

12. The plasma processing apparatus according to claim 1, having a high frequency power source connected to the two or more high frequency power supplying means, wherein the frequency of the high frequency power from the high frequency power source is controllable within the range of 50–450 MHz.

13. The plasma processing apparatus according to claim 1, wherein the plasma processing is formation of deposited films on the substrates.

14. The plasma processing apparatus according to claim 1, wherein the vessel can be depressurized.

15. The plasma processing apparatus according to claim 1, wherein the high frequency power supplying means are provided at equal intervals on the concentric circle having the same center as the concentric circle formed by the substrates.

16. A plasma processing apparatus comprising:
   a vessel;
   a mount portion on which two or more substrates can be placed equidistant from each other on a first circle with a first diameter in the vessel;
   a source gas introducing means for introducing a source gas into the vessel;
   two or more high frequency power supplying means;
   a cylindrical circumferential wall which surrounds the substrates to create a plasma discharge space in the vessel;
   wherein the high frequency power supplying means are arranged: (i) outside the plasma discharge space which is shielded inside by the circumferential wall and also outside the circumferential wall; (ii) concentrically with the first circle on second circle with a second diameter larger than the first diameter; and wherein a number of high frequency power supplying means is equal to or less than a number of the substrates placed on the mount portion.

17. The plasma processing apparatus according to claim 16, wherein the number of the high frequency power supplying means is the same as or one half of the number of the substrates placed on the mount portion.

18. The plasma processing apparatus according to claim 16, wherein the high frequency power supplying means are provided at equal intervals on a concentric circle having the same center as a placing circumference for the cylindrical substrates.

19. The plasma processing apparatus according to claim 16, wherein an additional high frequency power supplying means is provided inside the placing circumference for the cylindrical substrates.

20. The plasma processing apparatus according to claim 19, wherein the additional high frequency power supplying means is set at the center of the placing circumference for the cylindrical substrates.

21. The plasma processing apparatus according to claim 19, wherein two or more additional high frequency power supplying means are provided at equal intervals on a concentric circle having the same center as the placing circumference for the cylindrical substrates.

22. The plasma processing apparatus according to claim 19, wherein a high frequency power introduced from the high frequency power supplying means provided outside the placing circumference for the cylindrical substrates and a high frequency power introduced from the additional high frequency power supplying means are independently controllable.

23. The plasma processing apparatus according to claim 22, wherein the high frequency power introduced from the high frequency power supplying means and the high frequency power introduced from the additional high frequency power supplying means are supplied from a common oscillation source.

24. The plasma processing apparatus according to claim 16, wherein a cylindrical wall is provided to surround the cylindrical substrates and a center axis of the cylindrical wall passes the center of the placing circumference for the cylindrical substrates.

25. The plasma processing apparatus according to claim 24, wherein at least a part of the cylindrical wall is comprised of a non-conductive material.

26. The plasma processing apparatus according to claim 25, wherein the high frequency power supplying means provided outside the placing circumference for the cylindrical substrates are provided inside the cylindrical wall.

27. The plasma processing apparatus according to claim 16, wherein the source gas supplying means for supplying the source gas is provided inside and outside the placing circumference for the cylindrical substrates.

28. The plasma processing apparatus according to claim 16, having a high frequency power source connected to the high frequency power supplying means, wherein the frequency of the high frequency power from the high frequency power source is controllable within the range of 50–450 MHz.

29. The plasma processing apparatus according to claim 16, wherein the plasma processing forms deposited films on the substrates.

30. The plasma processing apparatus according to claim 16, wherein the vessel can be depressurized.

31. A plasma processing apparatus comprising:

a vessel;

a mount portion on which two or more substrates can be placed on a concentric circle in the vessel;

a source gas introducing means for introducing a source gas into the vessel;

two or more high frequency power supplying means;

a cylindrical circumferential wall which surrounds the substrates in the vessel to create a plasma discharge space in the vessel;

wherein the circumferential wall can shield the plasma discharge space inside thereof, wherein the high frequency power supply means are arranged outside the circumferential wall concentrically distant from the circumferential wall, and wherein the number of high frequency power supplying means is equal to or less than a number of the substrates placed on the mount portion.

32. The plasma processing apparatus according to claim 31, wherein a number of the high frequency power supplying means is equal to or less than a number of the substrates placed on the mount portion.

33. The plasma processing apparatus according to claim 32, wherein the number of the high frequency power supplying means is the same as or one half of the number of the substrates placed on the mount portion.

34. The plasma processing apparatus according to claim 31, wherein the concentric circle for placing the plurality of substrates is other than the concentric circle for providing the high frequency power supplying means.

35. The plasma processing apparatus according to claim 34, wherein the center of the concentric circle formed by the high frequency power supplying means is the same as the center of the concentric circle formed by the substrates.

36. The plasma processing apparatus according to claim 34, wherein the substrates are provided on another concentric circle at equal intervals.

37. The plasma processing apparatus according to claim 31, wherein the circumferential wall has a cylindrical shape.

38. The plasma processing apparatus according to claim 37, wherein the center axis of the cylindrical circumferential wall is set at the center of the concentric circle formed by the high frequency power supplying means.

39. The plasma processing apparatus according to claim 31, wherein the substrates each have a cylindrical shape.

40. The plasma processing apparatus according to claim 31, wherein the high frequency power supplying means each have a columnar shape.

41. The plasma processing apparatus according to claim 31, wherein the high frequency power supplying means are arranged at equal intervals concentrically.

42. The plasma processing apparatus according to claim 31, wherein an additional high frequency power supplying means other than the high frequency power supplying means is provided in the plasma discharge space.

43. The plasma processing apparatus according to claim 42, wherein the additional high frequency power supplying means is set at the center of the concentric circle formed by the substrates.

44. The plasma processing apparatus according to claim 42, wherein two or more additional high frequency power supplying means are provided.

45. The plasma processing apparatus according to claim 44, wherein the additional high frequency power supplying means are arranged concentrically distant at equal intervals in the concentric circle formed by the substrates.

46. The plasma processing apparatus according to claim 42, wherein the high frequency power supplying means and the additional high frequency power supplying means are independently controllable.

47. The plasma processing apparatus according to claim 31, wherein the source gas supplying means is provided inside and outside of the concentric circle formed by the substrates within the circumferential wall.

48. The plasma processing apparatus according to claim 31, wherein the high frequency power supplying means are capable of controllably supplying a power within the range of the frequency band of the VHF band.

49. The plasma processing apparatus according to claim 31, wherein the high frequency power supplying means are capable of controllably supplying a power within the range of 50–450 MHz.

50. The plasma processing apparatus according to claim 31, wherein the plasma processing forms deposited films on the substrates.

51. The plasma processing apparatus according to claim 31, wherein the circumferential wall comprises a non-conductive material.

52. The plasma processing apparatus according to claim 51, wherein the non-conductive material is a ceramic.

53. The plasma processing apparatus according to claim 51, wherein the non-conductive material comprises at least one material selected from the group consisting of alumina, titanium dioxide, aluminum nitride, boron nitride, zircon, cordierite, zircon-cordierite, silicon oxide, beryllium oxide, and mica ceramics.

54. The plasma processing apparatus according to claim 31, wherein the circumferential wall comprises a material with less absorbance of high frequency power.

55. The plasma processing apparatus according to claim 31, wherein the locations of two adjacent substrates and the location of the nearest high frequency power supplying means to the two adjacent substrates form an isosceles triangle.

56. A plasma processing apparatus comprising:
a vessel;
a mount portion on which two or more substrates can be placed on a concentric circle;
a circumferential wall which shields a plasma space inside thereof; and
a high frequency power supplying means for supplying a high frequency into the plasma space,
wherein the circumferential wall is provided to surround the substrates inside thereof, and wherein the whole of the circumferential wall is comprised of a non-conductive material.

57. The plasma processing apparatus according to claim 56, wherein the circumferential wall has a cylindrical shape.

58. A plasma processing apparatus comprising:
a vessel;
a mount portion on which two or more substrates can be placed on a concentric circle;
a circumferential wall which shields a plasma space inside thereof; and
a high frequency power supplying means for supplying a high frequency into the plasma space,
wherein the circumference wall is provided to surround the substrates inside thereof and has a cylindrical shape.

59. The plasma processing apparatus according to claim 58, wherein the whole of the circumferential wall is comprised of a non-conductive material.

60. A plasma processing apparatus comprising:
a vessel;
a mount portion on which two or more substrates can be placed on a first circle in the vessel;
a cylindrical circumferential wall with a center axis which is the same as the center of the placing circumference for the substrates and which shields a plasma space inside thereof; and
a high frequency power supplying means for supplying a high frequency into the plasma space,
wherein the circumferential wall is provided to surround the substrates inside thereof, and wherein the high frequency power supplying means is provided inside of the circumference wall.

61. A plasma processing apparatus comprising:
a vessel;
a mount portion on which two or more substrates can be placed on a first circle in the vessel;
a source gas introducing means for introducing a source gas into the vessel;
two or more high frequency power supplying means;
a cylindrical circumferential wall which surrounds the substrates in the vessel to create a plasma discharge space in the vessel and with a center axis which is the same as the center of the placing circumference for the substrates; and
wherein the circumferential wall is capable of shielding the plasma discharge space inside thereof, and wherein the high frequency power supplying means are rod-like electrodes provided concentrically distant from the circumferential wall or a circle with a center axis which is the same as the center of the placing circumference for the substrates and outside the circumferential wall.

* * * * *

UNITED STATES PATENT AND TRADEMARK OFFICE
CERTIFICATE OF CORRECTION

PATENT NO. : 6,155,201
DATED : December 5, 2000
INVENTOR(S) : Hitoshi Murayama et al.

It is certified that error appears in the above-identified patent and that said Letters Patent is hereby corrected as shown below:

Title page,
Item [56], References Cited, FOREIGN PATENT DOCUMENTS,
"6287760" should read -- 6-287760 --; and
"8253865" should read -- 8-253865 --.

Column 1,
Line 31, "substrate" should read -- substrate. --;
Line 42, "source," should read -- source. --;
Line 43, "specifically," should read -- Specifically, --; and
Line 53, "2114, and a" should read -- 2114. A --.

Column 2,
Line 21, "gage" should read -- gauge --.

Column 5,
Line 66, "of" should be deleted.

Column 12,
Line 65, "decreased will result." should read -- decreased film quantity will result. --.

Column 27,
Line 58, "the" should read -- or the --.

Column 31,
Line 35, "reduce" should read -- reducing --.

Column 35,
Lines 41-53, claim 56 should be deleted.

UNITED STATES PATENT AND TRADEMARK OFFICE
CERTIFICATE OF CORRECTION

PATENT NO.    : 6,155,201
DATED         : December 5, 2000
INVENTOR(S)   : Hitoshi Murayama et al.

It is certified that error appears in the above-identified patent and that said Letters Patent is hereby corrected as shown below:

Column 36,
Lines 1-16, claims 57 to 59 should be deleted.

Signed and Sealed this

Twelfth Day of March, 2002

*Attest:*

*Attesting Officer*

JAMES E. ROGAN
*Director of the United States Patent and Trademark Office*